US007004325B2

(12) United States Patent
Shoji

(10) Patent No.: US 7,004,325 B2
(45) Date of Patent: Feb. 28, 2006

(54) RESIN-MOLDED PACKAGE WITH CAVITY STRUCTURE

(75) Inventor: Hiroyuki Shoji, Kawasaki (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 86 days.

(21) Appl. No.: 10/144,313

(22) Filed: May 7, 2002

(65) Prior Publication Data

US 2003/0209465 A1 Nov. 13, 2003

(30) Foreign Application Priority Data

May 8, 2001 (JP) ............................. 2001-137611

(51) Int. Cl.
*B65D 85/30* (2006.01)

(52) U.S. Cl. ....................... 206/710; 206/832; 206/724

(58) Field of Classification Search ........ 206/710–713, 206/714, 715 X, 716, 832, 833, 701, 706
See application file for complete search history.

(56) References Cited

U.S. PATENT DOCUMENTS 4,470,507 A * 9/1984 Burns ......................... 206/714
5,686,698 A * 11/1997 Mahadevan et al. ....... 174/52.4
5,943,558 A * 8/1999 Kim et al. .................. 438/125
6,164,454 A * 12/2000 Freund et al. .............. 206/706
6,554,137 B1 * 4/2003 Fratti ......................... 206/713

FOREIGN PATENT DOCUMENTS

| | | | |
|---|---|---|---|
| EP | 1 096 563 A2 | | 5/2001 |
| JP | 2600689 | | 1/1997 |
| JP | 3127584 | | 11/2000 |
| KR | 2000006598 | * | 2/2000 |

* cited by examiner

*Primary Examiner*—Jila M. Mohandesi
(74) *Attorney, Agent, or Firm*—Young & Thompson

(57) ABSTRACT

A package includes: a substrate having a ridged peripheral portion and a center portion defined by and lower in level than the ridged peripheral portion. A semiconductor chip is mounted on the center portion. A plurality of lead is electrically coupled to the semiconductor chip and penetrates the substrate outwardly from the center portion. The package also includes a cap deeming a cavity space which accommodates the semiconductor chip. The cap has a cap bonding face bonded with a substrate bonding face of the ridged peripheral portion. The cap bonding face and the substrate bonding face are higher in level than the center portion.

30 Claims, 9 Drawing Sheets

RESIN-MOLDED PACKAGE WITH CAVITY STRUCTURE

BACKGROUND OF THE INVENTION

1. Field of the Invention

The present invention relates to a resin-molded package, and more particularly to a resin-molded package including a resin substrate and a resin-cap defining a cavity structure and having a reduced lead inductance for an ultra-high frequency semiconductor device.

2. Description of the Related Art

It has been known that a ceramic package with a cavity structure is suitable for packaging an ultra-high frequency semiconductor device because the ceramic package reduces a dielectric constant and a parasitic capacitance of the semiconductor device. The ceramic package is disadvantageous in its high cost and expensive.

On the other hand, a resin-molded package with a cavity structure has been attracted due to its lower cost and inexpensive. The resin-molded package includes a resin substrate, on which a semiconductor chip is mounted, and a resin cap which defines a cavity in cooperation with the semiconductor chip, so that the semiconductor chip is accommodated in the cavity space. The resin cap is adhered to the resin substrate.

For the ultra-high frequency semiconductor device, it is preferable to reduce an inductance thereof for suppressing a high frequency loss thereof. To reduce the inductance, it is preferable to make short as many as possible the length of the leads. In this viewpoint, a lead-less type cavity structured package is preferable.

Japanese patent No 2600689 and Japanese patent No. 3127584 disclose the lead-less type cavity structured packages. The lead-less type cavity structured package includes a resin substrate, a semiconductor chip mounted on the resin substrate, leads penetrating the resin substrate from an upper surface to a bottom level of the substrate and also being electrically coupled through metal wirings to the semiconductor chip, and a cap adhered to the resin substrate to define the cavity space which accommodates the semiconductor chip. This lead-less type cavity structured package is advantageous in less inductance of the leads than the leaded package with long leads which project outwardly from sides of the package and further which are bent downwardly outside the package.

The above lead-less type cavity structured packages disclosed in the above two Japanese patents have the following common disadvantages.

First, the above package is mounted on a circuit board through a solder bonding process which provides an electrical connection between the leads and conductive patterns of the circuit board. The solder bonding process is carried out by placing the package into a solder vessel which is filled with a flux. It is possible that a part of the flux enters into the cavity. If the resin substrate has a flat and horizontal top surface which bounds with the cap, then this flat and horizontal top surface makes it easy to allow the flux to enter into the cavity. If the flax eaters into the cavity and further is made into contact with at least a part of the semiconductor chip, then this may provide a failure to the electrical characteristic and performance of the packaged semiconductor device.

It is necessary to prevent or avoid the entry of flux into the cavity. In order to prevent or avoid the entry of flux into the cavity, it is effective that the top flat and horizontal surface of the resin substrate has a high level from the bottom level of the substrate so as to ensure a sufficient height of the top flat and horizontal surface of the resin substrate from a top surface of the flux. This means that the height or thickness of the resin substrate is large. This resin substrate structure needs long leads which penetrate from the upper surface thereof to the bottom surface or level thereof. The long leads have a large inductance which makes it difficult to suppress the undesirable high frequency loss of the ultra-high frequency semiconductor device.

Second, the flat and horizontal top surface of the resin substrate is bounded with the cap. In order to create a sufficient cavity space for the semiconductor chip with the bonding wires, it is necessary that the cap has a sufficiently large height. This results in a large total thickness or height of the package.

Third, the cap is aligned to the resin substrate by using an automatic assembling machine. The flat and horizontal top surface of the resin substrate allows displacement or miss-alignment of the cap to the resin substrate. The package size is small, for example, a diameter of about 2 millimeters and a thickness of about 0.5 millimeters. The displacement or miss-alignment makes defective the external dimension of the package. The defective external dimension of the package makes it easy to disconnect the metal wirings.

In the above circumstances, the development of a novel package with a cavity structure free from the above problems is desirable

SUMMARY OF THE INVENTION

Accordingly, it is an object of the present invention to provide a novel trackage with a cavity structure free from the above problems.

It is a further object of the present invention to provide a novel package with a cavity structure having a reduced lead inductance.

It is a still further object of the present invention to provide a novel package with a cavity structure having a reduced total height.

It is yet a further object of the present invention to provide a novel package with a cavity structure, which prevents an entry of flux into the cavity.

It is further more object of the present invention to provide a novel package with a cavity structure, which has a self-alignment feature between a cap and a substrate.

The present invention provides a package includes: a substrate having a ridged peripheral portion and a center portion defined by and lower in level than the ridged peripheral portion. A semiconductor chip is mounted on the center portion. A plurality of lead is electrically coupled to the semiconductor chip and penetrates the substrate outwardly from the center portion. The package also includes a cap defining a cavity space which accommodates the semiconductor chip. The cap has a cap bonding face bonded with a substrate bonding face of the ridged peripheral portion. The cap bonding face and the substrate bonding face are higher in level than the center portion.

The upper surface of the center portion, on which the semiconductor chip is mounted, is lower in level than a top of the ridged peripheral portion. This structural feature may advantageously prevent an undesirable entry of flux into the cavity. Namely, the ridged peripheral portion serves as a flux barrier wall which surrounds the center portion, on which the semiconductor chip is mounted, wherein the flux barrier wall is effective to prevent the entry of flux into the cavity. This may cause no failure to the electrical characteristic and performance of the packaged semiconductor device.

The above structural feature may also advantageously allow an effective reduction in thickness of the center portion so that a distance between upper and bottom surfaces of the center portion is reduced, thereby allowing a reduction in minimum length of the plurality of lead for penetrating the substrate outwardly from the center portion. The reduction in length of the plurality of lead decreases the inductance thereof. The decrease in the inductance of the plurality of leads makes it easy to suppress the undesirable high frequency loss of the high frequency semiconductor device.

The above structural feature may further provide an effective reduction in height of the cap with ensuring the sufficient cavity space which accommodates the semiconductor chip This allows an effective reduction in the total height of the package.

Further, the cap bonding face and the substrate bonding face are engaged with each other, and each of the cap bonding face, and the substrate bonding face includes at least a non-horizontal face for causing a self-alignment function for self-aligning the cap to the substrate. This self-alignment function allows an automatic assembling process by using an automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
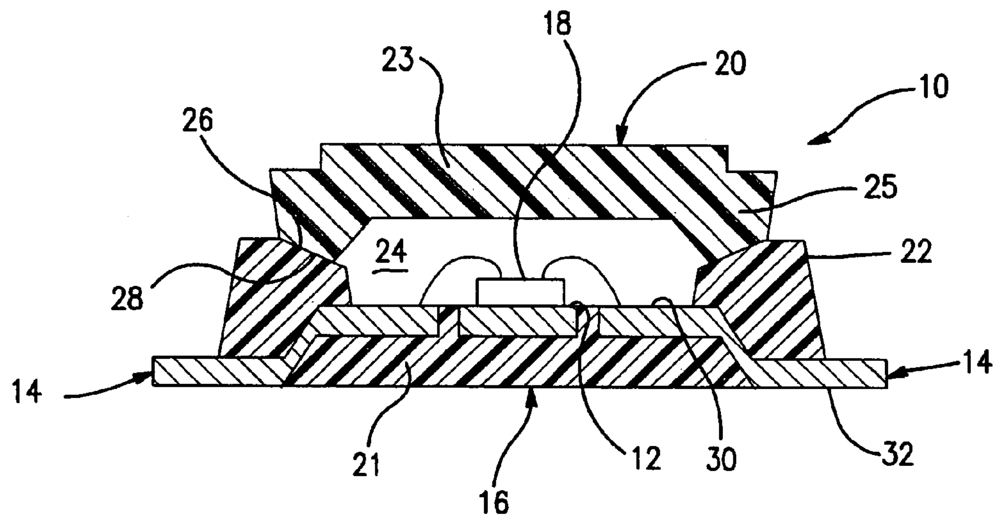
FIG. 1 is a cross sectional elevation view illustrative of an internal structure of a novel package with a cavity structure in a first embodiment in accordance with the present invention.

A first aspect of the present invention is a package including: a substrate having a ridged peripheral portion and a center portion defined by the ridged peripheral portion, and an upper surface of the center portion being lower in level than a top of the ridged peripheral portion; a semiconductor chip mounted on the upper surface of the center portion; a plurality of lead being electrically coupled to the semiconductor chip and the plurality of lead penetrating the substrate outwardly from the center portion; and a cap defining a cavity space which accommodates the semiconductor chip, and the cap having a cap bonding face bonded with a substrate bonding face of tho ridged peripheral portion, and the cap bonding face and the substrate bonding face being higher in level than the upper surface of the center portion.

The upper surface of the center portion, on which the semiconductor chip is mounted, is lower in level than the top of the ridged peripheral portion. This structural feature may advantageously prevent an undesirable entry of flux into the cavity. Namely, the ridged peripheral portion serves as a flux barrier wall which surrounds the upper surface of the center portion, on which the semiconductor chip is mounted, wherein the flux barrier wall is effective to prevent the entry of flux into the cavity. This may cause no failure to the electrical characteristic and performance of the packaged semiconductor device.

The above structural feature may also advantageously allow an effective reduction in thickness of the center portion so that a distance between upper and bottom surfaces of the center portion is reduced, thereby allowing a reduction in minimum length of the plurality of lead for penetrating the substrate outwardly from the center portion. The reduction in length of the plurality of lead decreases the inductance thereof. The decrease in the inductance of the plurality of leads makes it easy to suppress the undesirable high frequency loss of the high frequency semiconductor device.

The above structural feature may further provide an effective reduction in height of the cap with ensuring the sufficient cavity space which accommodates the semiconductor chip. This allows an effective reduction in the total height of the package.

Further, the cap bonding face and the substrate bonding face are engaged with each other, and each of the cap bonding face, and the substrate bonding face includes at least a non-horizontal face for causing a self-alignment function for self-aligning the cap to the substrate. This self-alignment function allows an automatic assembling process by using an automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

It is preferable that each of the cap bonding face and the substrate bonding face comprises an inwardly sloped-down plane surface which annularly extends. This structure provides the self-alignment function for self-aligning the cap to the substrate. If the cap is miss-aligned to the substrate, then the cap bonding face and the substrate bonding face are not engaged with each other, but also the inwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, the inwardly sloped-down plane surfaces provides the maximum height of the flux barrier wall at the outside thereof. This makes it difficult that the flux reaches an interface between the cap bonding face and the substrate bonding face, thereby preventing the entry of the flux into the cavity through the interface between the cap bonding face and the substrate bonding face.

It is also preferable that each of the cap bonding face and the substrate bonding face comprises a combination of a sloped plane surface and a horizontal and flat surface which annularly extend. This structure provides the self-alignment function for self-aligning the cap to the substrate. If the cap is miss-aligned to the substrate, then the cap bonding face and the substrate bonding face are not engaged with each other, but also the inwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

It is also preferable that each of the cap bonding face and the substrate bonding face comprises an outwardly sloped-down plane surface which annularly extends. This structure provides the self-alignment function for self-aligning the cap to the substrate. If the cap is miss-aligned to the substrate, then the cap bonding face and the substrate bonding face are not engaged with each other, but also the outwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, it is preferable that the inside periphery of the outwardly sloped-down plane surface of the substrate is positioned inside of the inside periphery of the outwardly sloped-down plane surface of the cap, so that the outwardly sloped-down plane surface of the substrate has an inside extending region which further extends in the inward and upward direction from the inside periphery of the outwardly sloped-down plane surface of the cap. The outwardly sloped-down plane surfaces provides the maximum height of the flux barrier wall at the inside thereof. The inside extending region of the outwardly sloped-down plane surface of the substrate makes it difficult that a part of the flux crimes up in the inward direction along the inside extending region, assuming that the part of the flux passes through the interface between the substrate bonding face and the cap bonding face due to capillary phenomenon. This ensures to prevent the flux from entering into the cavity.

It is also preferable that first one of the cap bonding face and the substrate bonding face includes at least a convexity which annularly extends and second one thereof comprises a concavity which aurally extends and engaged with the convexity. This structure with the combination of the engaging convexity and concavity provides the self-alignment function for self-aligning the cap to the substrate. If the cap is miss-aligned to the substrate, then the cap bonding face and the substrate bonding face are not engaged with each other, but also the combination of the engaging convexity and concavity guides the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, the combination of the engaging convexity and concavity contributes to capture a part of the flux wherein, assuming that the part of the flux passes through the interface between the substrate bonding face and the cap bonding face due to capillary phenomenon. This ensures to prevent the flux from entering into the cavity. It is particularly preferable that the cap bonding face comprises the convexity and the substrate bonding face comprises the concavity, and the substrate bonding face is wider width than the cap bonding face, so that the concavity is larger in size than the convexity. This further structural feature makes it easy to capture the part of the flux into the concavity. This ensures to prevent the flux from entering into the cavity.

For example, it is possible that the convexity comprises a rounded ridge which annularly extends, and the concavity comprises a rounded groove which annularly extends and is engaged with the rounded ridge. In this case, it is possible that the cap bonding face comprises the rounded ridge and the substrate bonding face comprises the rounded groove. Alternatively, it is possible that the cap bonding face comprises the rounded groove and the substrate bonding face comprises the rounded ridge.

For example, it is possible that the convexity comprises a tapered ridge which annularly extends, and the concavity comprises a tapered groove which annularly extends and is engaged with the tapered ridge. In this case, it is possible that the cap bonding face comprises the tapered ridge and the substrate bonding face comprises the tapered groove. Alternatively, it is possible that the cap bonding face comprises the tapered groove and the substrate bonding face comprises the tapered ridge. The tapered ridge may optionally comprise a V-shaped ridge, and the tapered groove may optionally comprise a V-shaped groove.

This structure with the combination of the engaging ridge and groove provides the self-alignment function for self-aligning the cap to the substrate. If the cap is miss-aligned to the substrate, then the cap bonding face and the substrate bonding face are not engaged with each other, but also the combination of the engaging ridge and groove guides the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, the combination of the engaging ridge and groove contributes to capture a part of the flux wherein, assuming that the part of the flux passes through the interface between the substrate bonding face and the cap bonding face due to capillary phenomenon. This ensures to prevent the flux from entering into the groove. It is particularly preferable that the cap bonding face comprises the ridge and the substrate bonding face comprises the groove, and the substrate bonding face is wider width than the cap bonding face, so that the groove is larger in size than the ridge. This further structural feature makes it easy to capture the part of the flux into the groove. This ensures to prevent the flux from entering into the cavity.

Further, alternatively, the tapered ridge may optionally comprise a trapezoid-shaped ridge, and the tapered groove may optionally comprise a trapezoid-shaped groove. The combination of the trapezoid-shaped ridge and groove makes it easy to apply an adhesive agent onto at least one of flat portions of the trapezoid-shaped ridge and groove.

It is preferable that the plurality of lead extends sloped from the upper surface of the center portion to a bottom periphery of the substrate. The slope-extension of the plurality of lead may also advantageously allow a further reduction in the length of the plurality of lead for penetrating the substrate outwardly from the center portion. The further reduction in length of the plurality of lead further decreases the inductance thereof. The further decrease in the inductance of the plurality of leads makes it easy to further suppress the undesirable high frequency loss of the high frequency semiconductor device.

It is preferable that the cap comprises a flat body and a peripheral portion which has the cap bonding face. The structural feature may provide a further reduction in height of the cap with ensuring the sufficient cavity space which accommodates the semiconductor chip. This allows a further reduction in the total height of the package.

A second aspect of the present invention is a package including a substrate having a peripheral portion and a center hollow portion defined by the peripheral portion, and an upper surface of the center hollow portion being lower in level than a top of the peripheral portion; a semiconductor chip mounted on the upper surface of the center hollow portion; a plurality of lead being electrically coupled to the semiconductor chip and the plurality of lead penetrating the substrate and extending sloped from the upper surface of the center hollow portion to a bottom periphery of the substrate; and a cap defining a cavity space which accommodates the semiconductor chip, and the cap comprising a flat body and a peripheral portion which has a cap bonding face bonded with a substrate bonding face of the peripheral portion, and the cap bonding face and the substrate bonding face being higher in level than the upper surface of the center hollow portion, the cap bonding face and the substrate bonding face being engaged with each other, and each of the cap bonding face and the substrate bonding face includes at least a non-horizontal face.

The upper surface of the center hollow portion, on which the semiconductor chip is mounted, is lower in level a top of than the peripheral portion. This structural feature may advantageously prevent an undesirable entry of flux into the cavity. Namely, the peripheral portion serves as a flux barrier wall which surrounds the center hollow portion, on which the semiconductor chip is mounted, wherein the flux barrier wall is effective to prevent the entry of flux into the cavity. This may cause no failure to the electrical characteristic and performance of the packaged semiconductor device.

The above structural feature may also advantageously allow an effective reduction in thickness of the center portion so that a distance between upper and bottom surfaces of the center portion is reduced, thereby allowing a reduction in minimum length of the plurality of lead for penetrating the substrate outwardly from the center portion. The reduction in length of the plurality of lead decreases the inductance thereof. The decrease in the inductance of the plurality of leads makes it easy to suppress the undesirable high frequency loss of the high frequency semiconductor device.

The above structural feature may further provide an effective reduction in height of the cap with ensuring the sufficient cavity space which accommodates the semiconductor chip. This allows an effective reduction in the total height of the package.

Further, the cap bonding face and the substrate bonding face are engaged with each other, and each of the cap bonding face, and the substrate bonding face includes at least a non-horizontal face for causing a self-alignment function for self-aligning the cap to the substrate. This self-alignment function allows an automatic assembling process by using an automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

It is preferable that each of the cap bonding face and the substrate bonding face comprises an inwardly sloped-down plane surface which annularly extends. This structure provides the self-alignment function for self-aligning the cap to the substrate. If the cap is miss-aligned to the substrate, then the cap bonding face and the substrate bonding face are not engaged with each other, but also the inwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, the inwardly sloped-down plane surfaces provides the maximum height of the flux barrier wall at the outside thereof. This makes it difficult that the flux reaches an interface between the cap bonding face and the substrate bonding face, thereby preventing the entry of the flux into the cavity through the interface between the cap bonding face and the substrate bonding face.

It is also preferable that each of the cap bonding face and the substrate bonding face comprises a combination of a sloped plane surface and a horizontal and flat surface which annularly extend. This structure provides the self-alignment function for self-aligning the cap to the substrate. If the cap is miss-aligned to the substrate, then the cap bonding face and the substrate bonding face are not engaged with each other, but also the inwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

It is also preferable that each of the cap bonding face and the substrate bonding face comprises an outwardly sloped-down plane surface which annularly extends. This structure provides the self-alignment function for self-aligning the cap to the substrate. If the cap is miss-aligned to the substrate, then the cap bonding face and the substrate bonding face are not engaged with each other, but also the outwardly sloped-down plane surfaces guide the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, it is preferable that the inside periphery of the outwardly sloped-down plane surface of the substrate is positioned inside of the inside periphery of the outwardly sloped-down plane surface of the cap, so that the outwardly sloped-down plane surface of the substrate has an inside extending region which further extends in the inward and upward direction from the inside periphery of the outwardly sloped-down plane surface of the cap. The outwardly sloped-down plane surfaces provides the maximum height of the flux barrier wall at the inside thereof. The inside extending region of the outwardly sloped-down plane surface of the substrate makes it difficult that a part of the flux crimes up in the inward direction along the inside extending region, assuming that the part of the flux passes through the interface between the substrate bonding face and the cap bonding face due to capillary phenomenon. This ensures to prevent the flux from entering into the cavity.

It is also preferable that first one of the cap bonding face and the substrate bonding face includes at least a convexity which annularly extends and second one thereof comprises a concavity which extends and engaged with the convexity. This structure with the combination of the engaging convexity and concavity provides the self-alignment function for self-aligning the cap to the substrate. If the cap is miss-aligned to the substrate, then the cap bonding face and the substrate bonding face are not engaged with each other, but also the combination of the engaging convexity and concavity guides the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection. The above self-alignment function also allows the mass production and improves the yield of the final product.

Further, the combination of the engaging convexity and concavity contributes to capture a part of the flux wherein, assuming that the part of the flux passes through the interface between the substrate bonding face and the cap bonding face due to capillary phenomenon. This ensures to prevent the flux from entering into the cavity. It is particularly preferable that the cap bonding face comprises the convexity and the substrate bonding face comprises the concavity, and the substrate bonding face is wider width than the cap bonding face, so that the concavity is larger in size than the convexity. This further structural feature makes it easy to capture the part of the flux into the concavity. This ensures to prevent the flux from entering into the cavity.

For example, it is possible that the convexity comprises a rounded ridge which annularly extends, and the concavity comprises a rounded groove which annularly extends and is engaged with the rounded ridge. In this case, it is possible that the cap bonding face comprises the rounded ridge and the substrate bonding face comprises the rounded groove. Alternatively, it is possible that the cap bonding face comprises the rounded groove and the substrate bonding face comprises the rounded ridge.

For example, it is possible that the convexity comprises a tapered ridge which annularly extends, and the concavity comprises a tapered groove which annularly extends and is engaged with the tapered ridge. In this case, it is possible that the cap bonding face comprises the tapered ridge and the substrate bonding face comprises the tapered groove. Alternatively, it is possible that the cap bonding face comprises the tapered groove and the substrate bonding face comprises the tapered ridge. The tapered ridge may optionally comprise a V-shaped ridge, and the tapered groove may optionally comprise a V-shaped groove.

This structure with the combination of the engaging ridge and groove provides the self-alignment function for self-aligning the cap to the substrate. If the cap is miss-aligned to the substrate, then the cap bonding face and the substrate bonding face are not engaged with each other, but also the combination of the engaging ridge and groove guides the cap to be just-aligned to the substrate, whereby the cap bonding face and the substrate bonding face become engaged with each other. This self-alignment function allows the automatic assembling process by using the automatic assembling machine without any excess high handing-accuracy. The above self-alignment function makes non-defective the external dimension of the package. The non-defective external dimension of the package makes the metal wirings free from any undesirable disconnection The above self-alignment function also allows the mass production and improves the yield of the final product.

Further, the combination of the engaging ridge and groove contributes to capture a part of the flux wherein, assuming that the part of the flux passes through the interface between the substrate bonding face and the cap bonding face due to capillary phenomenon. This ensures to prevent the flux from entering into the groove. It is particularly preferable that the cap bonding face comprises the ridge and the substrate bonding face comprises the groove, and the substrate bonding face is wider width than the cap bonding face, so that the groove is larger in size than the ridge. This further structural feature makes it easy to capture the part of the flux into the groove. This ensures to prevent the flux from entering into the cavity.

Further, alternatively, the tapered ridge may optionally comprise a trapezoid-shaped ridge, and the tapered groove may optionally comprise a trapezoid-shaped groove. The combination of the trapezoid-shaped ridge and groove makes it easy to apply an adhesive agent onto at least one of flat portions of the trapezoid-shaped ridge and groove.

Figure 2:
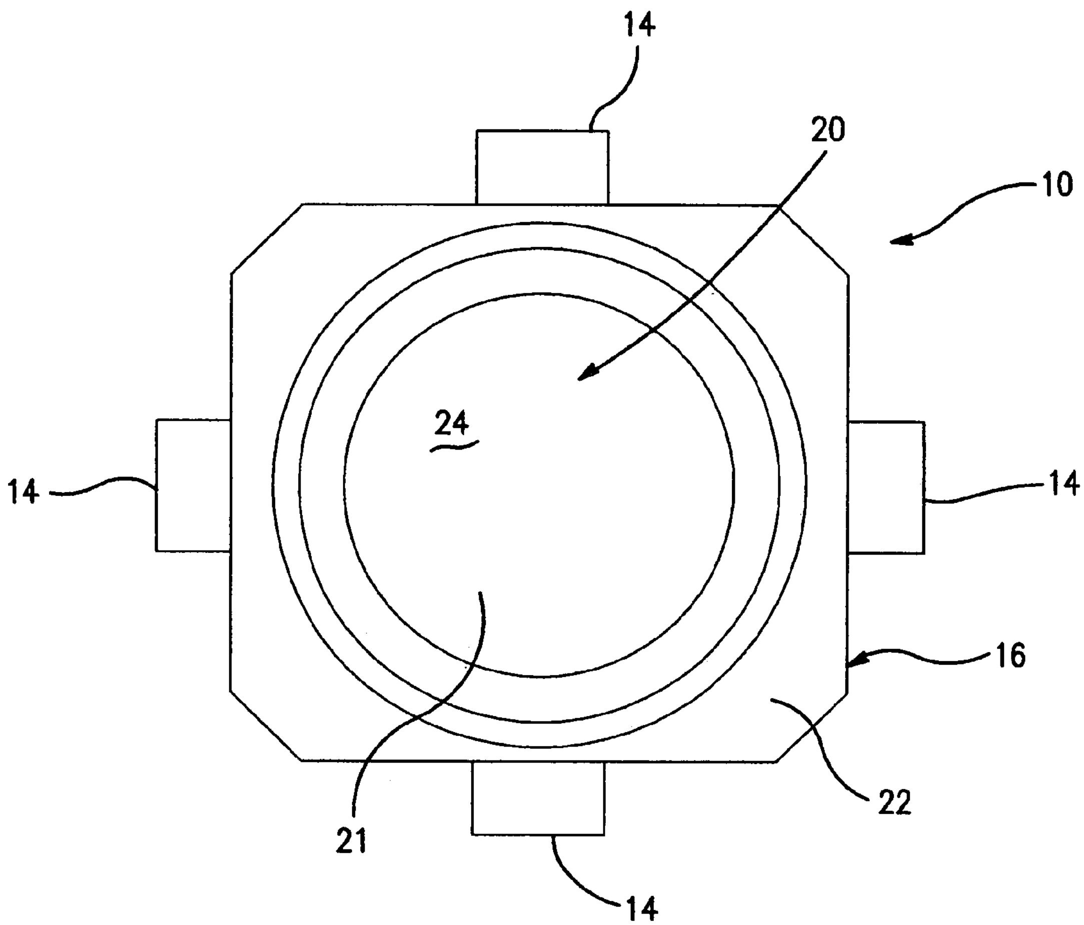
FIG. 2 is a plan view illustrative of a novel package with a cavity structure shown in FIG. 1.

First Embodiment:

A first embodiment according to the present invention will be described in detail with reference to the drawings. FIG. 1 is a cross sectional elevation view illustrative of an internal structure of a novel package with a cavity structure in a first embodiment in accordance with the present invention. FIG. 2 is a plan view illustrative of a novel package with a cavity structure shown in FIG. 1.

A package 10 with a cavity structure includes a resin substrate 16, a semiconductor chip 18, and a cap 20. The resin substrate 16 further includes a die pad 12 and a set of four leads 14. The resin substrate 16 comprises a thickness-reduced center hollow portion 21 and a ridged peripheral portion 22. The ridged peripheral portion 22 extends annularly surrounding the periphery of the thickness-reduced center hollow portion 21. An upper surface of the thickness-reduced center hollow portion 21 is lower in level than the top of the ridged peripheral portion 22. The ridged peripheral portion 22 serves as a barrier wall to flux for keeping the thickness-reduced center hollow portion 21 from the flux.

The die pad 12 is selectively provided in the thickness-reduced center hollow portion 21. An upper surface of the die pad 12 has substantially the same level as an upper surface of the thickness-reduced center hollow portion 21. The semiconductor chip 18 is mounted on the die pad 12. The die pad 12 is positioned at a center of the resin substrate 16 in a plan view. The die pad 12 is molded and united within the thickness-reduced center hollow portion 21.

In the plan view, the four leads 14 extend radially and outwardly from around the die pad 12 in four directions respectively. In the cross sectional view, each of the four leads 14 penetrates the resin substrate 16 from the upper surface of the thickness-reduced center hollow portion 21 to a bottom periphery of the resin substrate 16, and further projects outwardly from the bottom periphery. The each lead 14 comprises a high level inside portion, an intermediate sloped portion, and a low level outside portion.

The high level inside portion lies along the upper surface of the thickness-reduced center hollow portion 21. The high level inside portion has an upper-side exposed surface 30 which is exposed from the upper surface of the thickness-reduced center hollow portion 21. The upper-side exposed surface 30 is electrically connected through a metal wiring to the semiconductor chip 18. The low level outside portion lies along the bottom surface of the resin substrate 16 and is positioned outside of the high level inside portion. The low level outside portion has a lower-side exposed surface 32 which is exposed from the bottom of the resin substrate 16. The intermediate sloped portion is gradually sloped-down outwardly for providing a smooth connection between the high level inside portion and the low level outside portion. The each lead 14 is molded and united within the resin substrate 16.

The ridged peripheral portion 22 extends annularly surrounding the periphery of the thickness-reduced center hollow portion 21. The ridged peripheral portion 22 includes an inside wall, an outside wall opposite to the inside wall as well as a flat top face and an inwardly sloped-down face. The inwardly sloped-down face is bounded between the inside wall and the flat top face. The inwardly sloped-down face extends outside the inside wall and inside the flat top face. The flat top face is bounded between the inwardly sloped-down face and the outside wall. The flat top face extends outside the inwardly sloped-down face and inside the outside wall. The inwardly sloped-down face has a circular band shape in the plan view. The inwardly sloped-down face has a uniform slope angle. In the geometrical viewpoint, the three dimensional shape of the inwardly sloped-down face corresponds to a part of a conical inner face, namely an inner face of a short truncated cone. The inwardly sloped-down face provides a substrate bonding face 28 for bonding with the cap 20.

The cap 20 is bonded or adhered to the substrate bonding face 28 comprising the inwardly sloped-down face of the ridged peripheral portion 22 of the resin substrate 16, whereby in co-operation with the resin substrate 16, the cap 20 defines a cavity 24 which accommodates the semiconductor chip 18. The cavity also contributes to reduce the parasitic capacitance. The cap 20 comprises a disk-shaped body 23 and a ridged peripheral portion 25 which extends annularly surrounding a periphery of the disk-shaped body 23. The disk-shaped body 23 is generally flat and relatively thin. The ridged peripheral portion 25 is ridged downwardly and toward the resin substrate 16.

The ridged peripheral portion 25 includes an inside wall, an outside wall opposite to the inside wall as well as an inwardly sloped-down face, provided that the cap 20 is bonded to the resin substrate 16 and the inner wall is faced down. The inwardly sloped-down face is bounded between the inside and outside walls. The inwardly sloped-down face extends outside the inside wall and inside the outside wall. The inwardly sloped-down face has a circular band shape in the bottom view. In the geometrical viewpoint, the three dimensional shape of the inwardly sloped-down face corresponds to a part of a conical outer face, namely an outer face of a short truncated cone.

The inwardly sloped-down face of the cap 20 provides a cap bonding face 26 which is adjusted with and engaged with the substrate bonding face 28 of the resin substrate 16. The cap bonding face 26 has a uniform slope angle which is identical with the uniform slop angle of the above substrate bonding face 28, so that the cap bonding face 26 is tightly contact and engaged with the substrate bonding face 28. As well illustrated, the cap bonding face 26 may optionally be little narrower in width than the substrate bonding face 28.

The cap bonding face 26 extends inside the flat top face of the ridged peripheral portion 22 of the resin substrate 16. The inside periphery of the cap bonding face 26 extends outside the inside periphery of the substrate bonding face 28. The bonding interface between the cap bonding face 26 and the substrate bonding face 28 extends downwardly from the top level of the resin substrate 16. This may contribute to reduce the total height or thickness of the package 10.

The above package 10 provides the following advantages.

The thickness-reduced center hollow portion 21 contributes to form the cavity 24 which accommodates the semiconductor chip 18, whilst the resin substrate 16 and the cap 20 are relatively reduced in height or thickness, and thus the total height or thickness of the package is reduced.

The upper surface of the thickness-reduced center hollow portion 21, on which the semiconductor chip 18 is mounted, is lower in level than the top of the ridged peripheral portion 22 of the resin substrate 16. This structural feature may advantageously prevent an undesirable entry of flux into the cavity 24. Namely, the ridged peripheral portion 22 serves as a barrier wall to flux which surrounds the thickness-reduced center hollow portion 21, on which the semiconductor chip 18 is mounted. The flux barrier wall of the ridged peripheral portion 22 is effective to prevent the entry of flux into the cavity 24. This may cause no failure to the electrical characteristic and performance of the packaged semiconductor device.

Further, the inwardly sloped-down planes of the cap bonding face 26 and the substrate bonding face 28 provide the maximum height of the flux barrier wall of the ridged peripheral portion 22 at the outside thereof. This makes it difficult that the flux reaches an interface between the cap bonding face 26 and the substrate bonding face 28, thereby preventing the entry of the flux into the cavity 24 through the interface between the cap bonding face 26 and the substrate bonding face 28.

The above structural feature may also advantageously allow an effective reduction in thickness of the thickness-reduced center hollow portion 21 so that a distance between upper and bottom surfaces of the thickness-reduced center hollow portion 21 is reduced, thereby allowing a reduction in the length of the leads 14 which extends from the upper surfacer of the thickness-reduced center hollow portion 21 to the bottom periphery of the resin substrate 16. The reduction in length of the leads 14 decreases the inductance thereof. The decrease in the inductance of the leads 14 makes it easy to suppress the undesirable high frequency loss of the high frequency semiconductor device.

Further, the each lead 14 includes the intermediate sloped portion. The slope-extension may also advantageously allow a further reduction in the length of the leads 14 for penetrating the resin substrate 16. The further reduction in length of the leads 14 further decreases the inductance thereof. The further decrease in the inductance of the leads 14 makes it easy to further suppress the undesirable high frequency loss of the high frequency semiconductor device.

The above structural feature may further provide an effective reduction in height of the cap 20 with ensuring the sufficient space of the cavity 24 which accommodates the semiconductor chip 18. This allows an effective reduction in the total height of the package.

Further, the cap bonding face 26 and the substrate bonding face 28 are engaged tightly with each other, and each of the cap bonding face 26, and the substrate bonding face 28 comprises the sloped face or the non-horizontal face, which causes a self-alignment function for self-aligning the cap 20 to the resin substrate 16 due to a self-weight of the cap 20. This self-alignment function allows a desirable automatic assembling process by using an automatic assembling machine without any excess high handing-accuracy. The above self-alignment function makes non-defective the external dimension of the package 10. The non-defective external dimension of the package 10 makes the metal wirings free from any undesirable disconnection. The above self-alignment function also allows the mass production and improves the yield of the final product.

In addition, the cap bonding face 26 extends inside the flat top face of the ridged peripheral portion 22 of the resin substrate 16. The inside periphery of the cap bonding face 26 extends outside the inside periphery of the substrate bonding face 28. The bonding interface between the cap bonding face 26 and the substrate bonding face 28 extends downwardly from the top level of the resin substrate 16. This may contribute to reduce the total height or thickness of the package 10.

Figure 3:
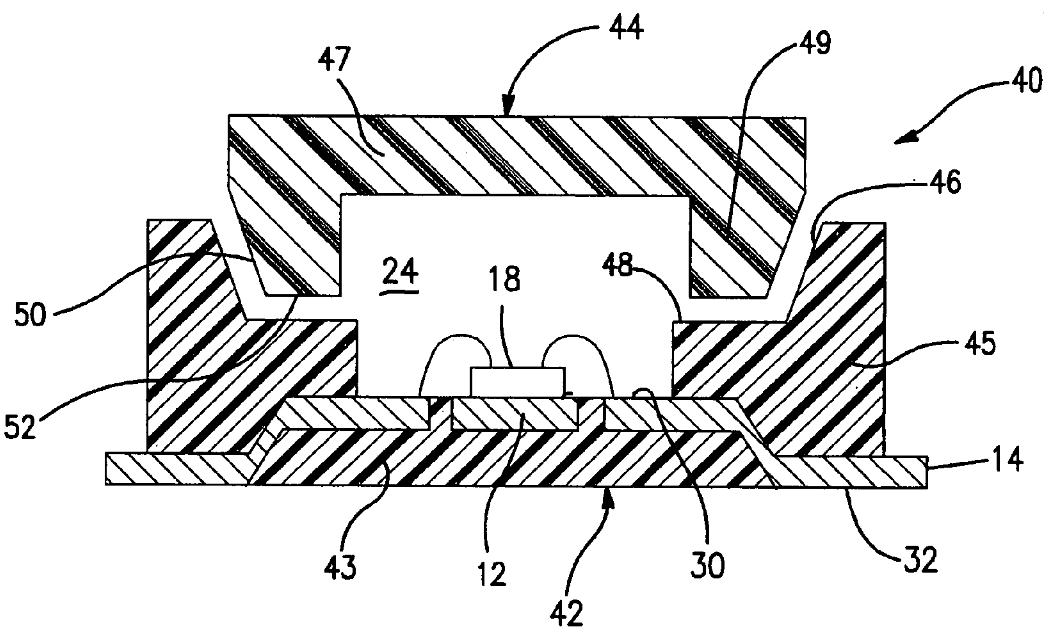
FIG. 3 is a cross sectional elevation view illustrative of an internal structure of a novel package with a cavity structure in a second embodiment in accordance with the present invention.

Second Embodiment:

A second embodiment according to the present invention will be described in detail with reference to the drawings. FIG. 3 is a cross sectional elevation view illustrative of an internal structure of a novel package with a cavity structure in a second embodiment in accordance with the present invention. The package of this second embodiment is different from the package of the first embodiment in the engaging substrate and cap bonding faces.

A package 40 with a cavity structure includes a resin substrate 42, a semiconductor chip 18, and a cap 44. The resin substrate 42 further includes a die pad 12 and a set of four leads 14. The resin substrate 42 comprises a thickness-reduced center hollow portion 43 and a ridged peripheral portion 45. The ridged peripheral portion 45 extends annularly surrounding the periphery of the thickness-reduced center hollow portion 43. An upper surface of the thickness-reduced center hollow portion 43 is lower in level than the top of the ridged peripheral portion 45. The ridged peripheral portion 45 serves as a barrier wall to flux for keeping the thickness-reduced center hollow portion 43 from the flux.

The ridged peripheral portion 45 extends annularly surrounding the periphery of the thickness-reduced center hollow portion 43. The ridged peripheral portion 45 includes an inside wall, an outside wall opposite to the inside wall as well as a flat top face, an inwardly sloped-down face and a flat terrace. The flat terrace is bounded between the inwardly sloped-down face and the inside wall. The flat terrace extends outside the inside wall and inside the inwardly sloped-down face. The flat terrace is higher in level than the upper surface of the thickness-reduced center hollow portion 43, but lower in level than the flat top face.

The inwardly sloped-down face is bounded between the flat terrace and the flat top face. The inwardly sloped-down face extends outside the flat terrace and inside the flat top face. The flat top face is bounded between the inwardly sloped-down face and the outside wall. The flat top face extends outside the inwardly sloped-down face and inside the outside wall. The flat terrace has a circular band shape in the plan view, and no slope angle in cross sectional view. The inwardly sloped-down face has a circular band shape in the plan view. The inwardly sloped-down face has a uniform slope angle. In the geometrical viewpoint, the three dimensional shape of the inwardly sloped-down face corresponds to a part of a conical inner face, namely an inner face of a short truncated cone. The inwardly sloped-down face provides a first substrate bonding face 46 for bonding with the cap 44. The flat terrace also provides a second substrate bonding face 48 for bonding with the cap 44. The combination of the first and second substrate bonding faces 46 and 48 provides the united substrate bonding face.

The cap 44 is bonded or adhered to the first and second substrate bonding faces 46 and 48 respectively comprising the inwardly sloped-down face and the flat terrace of the ridged peripheral portion 45 of the resin substrate 42, whereby in co-operation with the resin substrate 42, the cap 44 defines a cavity 24 which accommodates the semiconductor chip 18. The cavity also contributes to reduce the parasitic capacitance. The cap 44 comprises a disk-shaped body 47 and a ridged peripheral portion 49 which extends annularly surrounding a periphery of the disk-shaped body 47. The disk-shaped body 47 is generally flat and relatively thin. The ridged peripheral portion 49 is ridged downwardly and toward the resin substrate 42.

The ridged peripheral portion 49 includes an inside wall, an outside wall opposite to the inside wall as well as a flat bottom face and an inwardly sloped-down face, provided that the cap 44 is bonded to the resin substrate 42 and the inner wall is faced down. The flat bottom face is bounded between the inside wall and the inwardly sloped-down face. The flat bottom face extends outside the inside wall and inside the inwardly sloped-down face. The flat bottom face has a circular band shape in the bottom view. The inwardly sloped-down face is bounded between the flat bottom face and the outside wall. The inwardly sloped-down face extends outside the flat bottom face and inside the outside wall. The inwardly sloped-down face has a circular band shape in the bottom view. In the geometrical viewpoint, the three dimensional shape of the inwardly sloped-down face corresponds to a part of a conical outer face, namely an outer face of a short truncated cone.

The inwardly sloped-down face of the cap 44 provides a first cap bonding face 50 which is adjusted with and engaged with the first substrate bonding face 46 of the resin substrate 42. The flat bottom face of the cap 44 provides a second cap bonding face 52 which is adjusted with and engaged with the second substrate bonding face 48 of the resin substrate 42. The first cap bonding face 50 has a uniform slope angle which is identical with the uniform slop angle of the above first substrate bonding face 46, so that the first cap bonding face 50 is tightly contact and engaged with the first substrate bonding face 46. The second cap bonding face 52 has no slope angle which is identical with the above second substrate bonding face 48, so that the second cap bonding face 52 is tightly contact and engaged with the second substrate bonding face 48. As well illustrated, the second cap bonding face 52 may optionally be little narrower in width than the second substrate bonding face 48.

The above package 40 provides the following advantages.

Similarly to the first embodiment, the thickness-reduced center hollow portion 43 contributes to form the cavity 24 which accommodates the semiconductor chip 18, whilst the resin substrate 42 and the cap 44 are relatively reduced in height or thickness, and thus the total height or thickness of the package is reduced.

Similarly also to the first embodiment, the upper surface of the thickness-reduced center hollow portion 43, on which the semiconductor chip 18 is mounted, is lower in level than the top of the ridged peripheral portion 45 of the resin substrate 42. This structural feature may advantageously prevent an undesirable entry of flux into the cavity 24. Namely, the ridged peripheral portion 45 serves as a barrier wall to flux which surrounds the thickness-reduced center hollow portion 43, on which the semiconductor chip 18 is mounted. The flux barrier wall of the ridged peripheral portion 45 is effective to prevent the entry of flux into the cavity 24. This may cause no failure to the electrical characteristic and performance of the packaged semiconductor device.

Similarly also to the first embodiment, the inwardly sloped-down planes of the first cap bonding face 50 and the first substrate bonding face 46 provide the maximum height of the flux barrier wall of the ridged peripheral portion 45 at the outside thereof. This makes it difficult that the flux reaches an interface between the first cap bonding face 50 and the first substrate bonding face 46, thereby preventing the entry of the flux into the cavity 24 through the interface between the first cap bonding face 50 and the first substrate bonding face 46.

Similarly also to the first embodiment, the above structural feature may also advantageously allow an effective reduction in thickness of the thickness-reduced center hollow portion 43 so that a distance between upper and bottom surfaces of the thickness-reduced center hollow portion 43 is reduced, thereby allowing a reduction in the length of the leads 14 which extends from the upper surface of the thickness-reduced center hollow portion 43 to the bottom periphery of the resin substrate 42. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 44 with ensuring the sufficient space of the cavity 24 which accommodates the semiconductor chip 18. This allows an effective reduction in the total height of the package.

Further, the first cap bonding face 50 and the first substrate bonding face 46 are engaged tightly with each other, and each of the cap bonding face 50, and the first substrate bonding face 46 comprises the sloped face or the non-horizontal face, which causes a self-alignment function for self-aligning the cap 44 to the resin substrate 42 due to a self-weight of the cap 44. This self-alignment function allows a desirable automatic assembling process by using an automatic assembling machine without any excess high handing-accuracy. The above self-alignment function makes non-defective the external dimension of the package 40. The non-defective external dimension of the package 40 makes the metal wirings free from any undesirable disconnection. The above self-alignment function also allows the mass production and improves the yield of the final product.

In addition, the second cap bonding face 52 and the second substrate bonding face 48 are engaged tightly with each other, and each of the second cap bonding face 52 and the second substrate bonding face 48 comprises the flat face or the horizontal face which makes it easy to apply an adhesive agent onto at least one of the second cap bonding face 52 and the second substrate bonding face 48 for bonding the cap 44 to the resin substrate 42. This may contribute to improve the productivity of the package 40.

Figure 4:
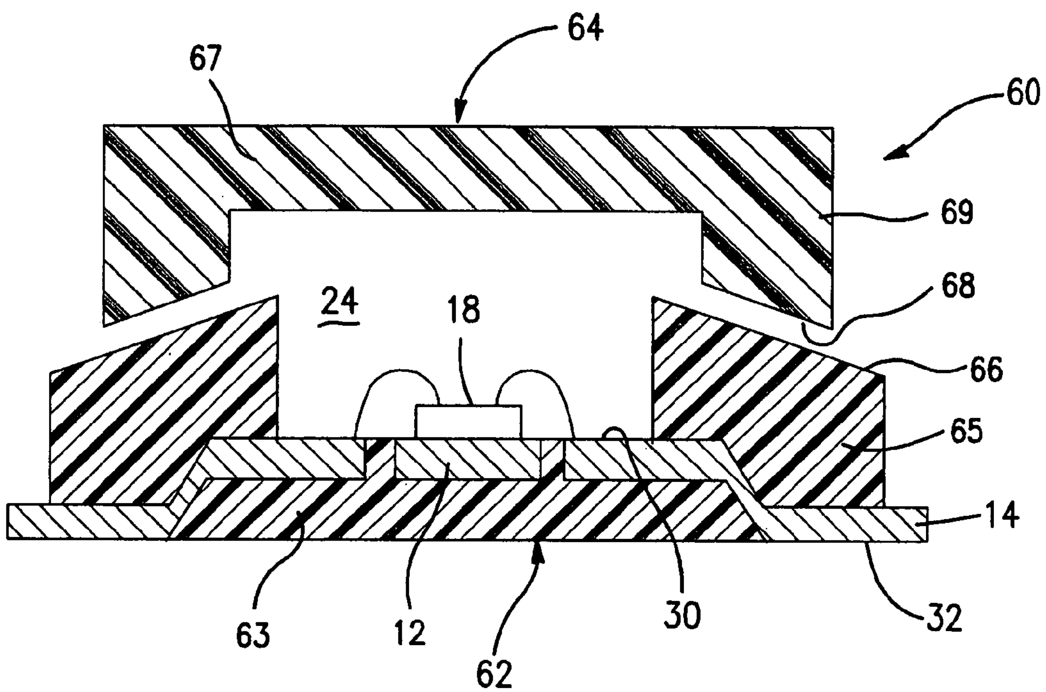
FIG. 4 is a cross sectional elevation view illustrative of an internal structure of a novel package with a cavity structure in a third embodiment in accordance with the present invention.

Third Embodiment:

A third embodiment according to the present invention will be described in detail with reference to the drawings. FIG. 4 is a cross sectional elevation view illustrative of an internal structure of a novel package with a cavity structure in a third embodiment in accordance with the present invention. The package of this third embodiment is different from the package of the first embodiment in the cap and substrate bonding faces.

A package 60 with a cavity structure includes a resin substrate 62, a semiconductor chip 18, and a cap 64. The resin substrate 62 further includes a die pad 12 and a set of four leads 14. The resin substrate 62 comprises a thickness-reduced center hollow portion 63 and a ridged peripheral portion 65. The ridged peripheral portion 65 extends annularly surrounding the periphery of the thickness-reduced center hollow portion 63. An upper surface of the thickness-reduced center hollow portion 63 is lower in level than the top of the ridged peripheral portion 65. The ridged peripheral portion 65 serves as a barrier wall to flux for keeping the thickness-reduced center hollow portion 63 from the flux.

The ridged peripheral portion 65 extends annularly surrounding the periphery of the thickness-reduced center hollow portion 63. The ridged peripheral portion 65 includes an inside wall, an outside wall opposite to the inside wall as well as an outwardly sloped-down face. The outwardly sloped-down face is bounded between the inside and outside walls. The outwardly sloped-down Lace extends outside the inside wall and inside the outside wall. The outwardly sloped-down face has a circular band shape in the plan view. The outwardly sloped-down face has a uniform slope angle. In the geometrical viewpoint, the three dimensional shape of the outwardly sloped-down face corresponds to a part of a conical outer face, namely an outer face of a short truncated cone. The outwardly sloped-down face provides a substrate bonding face 66 for bonding with the cap 64.

The cap 64 is bonded or adhered to the substrate bonding face 66 comprising the outwardly sloped-down face of the ridged peripheral portion 65 of the resin substrate 62, whereby in co-operation with the resin substrate 62, the cap 64 defines a cavity 24 which accommodates the semiconductor chip 18. The cavity also contributes to reduce the parasitic capacitance. The cap 64 comprises a disk-shaped body 67 and a ridged peripheral portion 69 which extends annularly surrounding a periphery of the disk-shaped body 67. The disk-shaped body 67 is generally flat and relatively thin. The ridged peripheral portion 69 is ridged downwardly and toward the resin substrate 62.

The ridged peripheral portion 69 includes an inside wall, an outside wall opposite to the inside wall as well as an outwardly sloped-down face, provided that the cap 64 is bonded to the resin substrate 62 and the inner wall is faced down. The outwardly sloped-down face is bounded between the inside and outside walls. The outwardly sloped-down face extends outside the inside wall and inside the outside wall. The outwardly sloped-down face has a circular band shape in the bottom view. In the geometrical viewpoint, the three dimensional shape of the outwardly sloped-down face corresponds to a part of a conical inner faces namely an inner face of a short truncated cone.

The outwardly sloped-down face of the cap 64 provides a cap bonding face 68 which is adjusted with and engaged with the substrate bonding face 66 of the resin substrate 62. The cap bonding face 68 has a uniform slope angle which is identical with the uniform slop angle of the above substrate bonding face 66, so that the cap bonding face 68 is tightly contact and engaged with the substrate bonding face 66.

As well illustrated, the cap bonding face 68 may optionally be narrower in width than the substrate bonding face 66. Namely, the outside periphery of the cap bonding face 68 extends inside the outside periphery of the substrate bonding face 66, whilst the inside periphery of the cap bonding face 68 extends outside the inside periphery of the substrate bonding face 66.

The above package 60 provides the following advantages.

The thickness-reduced center hollow portion 63 contributes to form the cavity 24 which accommodates the semiconductor chip 18, whilst the resin substrate 62 and the cap 64 are relatively reduced in height or thickness, and thus the total height or thickness of the package is reduced.

The upper surface of the thickness-reduced center hollow portion 63, on which the semiconductor chip 18 is mounted, is lower in level than the top of the ridged peripheral portion 65 of the resin substrate 62. This structural feature may advantageously prevent an undesirable entry of flux into the cavity 24. Namely, the ridged peripheral portion 65 serves as a barrier wall to flux which surrounds the thickness-reduced center hollow portion 63, on which the semiconductor chip 18 is mounted. The flux barrier wall of the ridged peripheral portion 65 is effective to prevent the entry of flux into the cavity 24. This may cause no failure to the electrical characteristic and performance of the packaged semiconductor device.

Further, the cap bonding face 68 is narrower in width than the substrate bonding face 66. Namely, the outside periphery of the cap bonding face 68 extends inside the outside periphery of the substrate bonding face 66, whilst the inside periphery of the cap bonding face 68 extends outside the inside periphery of the substrate bonding face 66. This structural feature enhances the self-alignment function. If the cap 64 is placed with miss-alignment over the resin substrate 62, then the wide substrate bonding face 66 receives the cap bonding face 68, and allows the cap 64 to be self-aligned to the resin substrate 62.

The above structural feature may also advantageously allow an effective reduction in thickness of the thickness-reduced center hollow portion 63 so that a distance between upper and bottom surfaces of the thickness-reduced center hollow portion 63 is reduced, thereby allowing a reduction in the length of the leads 14 which extends from the upper surface of the thickness-reduced center hollow portion 63 to the bottom periphery of the resin substrate 62. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 64 with ensuring the sufficient space of the cavity 24 which accommodates the semiconductor chip 18. This allows an effective reduction in the total height of the package.

Further, the cap bonding face 68 and the substrate bonding face 66 are engaged tightly with each other, and each of the cap bonding face 68, and the substrate bonding face 66 comprises the sloped face or the non-horizontal face, which causes a self-alignment function for self-aligning the cap 64 to the resin substrate 62 due to a self-weight of the cap 64. This self-alignment function allows a desirable automatic assembling process by using an automatic assembling machine without any excess high handing-accuracy. The above self-alignment function makes non-defective the external dimension of the package 60. The non-defective external dimension of the package 60 makes the metal wirings free from any undesirable disconnection. The above self-alignment function also allows the mass production and improves the yield of the final product.

In addition, the substrate bonding face 66 has an inside extending region which further extends in the inward and upward direction from the inside periphery of the cap bonding face 68. The outwardly sloped-down planes provides the maximum height of the flux barrier wall at the inside thereof. The inside extending region of the substrate bonding face 66 makes it difficult that a part of the flux crimes up in the inward direction along the inside extending region, assuming that the part of the flux passes through the interface between the substrate bonding face 66 and the cap bonding face 68 due to capillary phenomenon. This ensures to prevent the flux from entering into the cavity.

Figure 5:
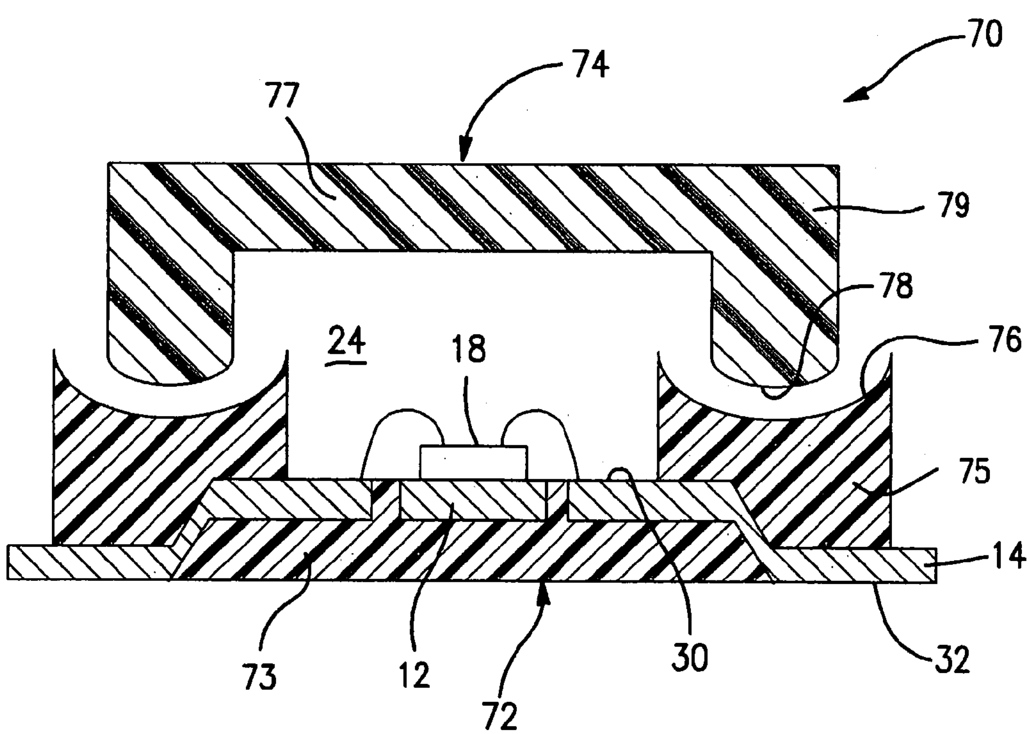
FIG. 5 is a cross sectional elevation view illustrative of an internal structure of a novel package with a cavity structure in a fourth embodiment in accordance with the present invention.

Fourth Embodiment:

A fourth embodiment according to the present invention will be described in detail with reference to the drawings. FIG. 5 is a cross sectional elevation view illustrative of an internal structure of a novel package with a cavity structure in a fourth embodiment in accordance with the present invention. The package of this fourth embodiment is different from the package of the first embodiment in the substrate and cap bonding faces.

A package 70 with a cavity structure includes a resin substrate 72, a semiconductor chip 18, and a cap 74. The resin substrate 72 further includes a die pad 12 and a set of four leads 14. The resin substrate 72 comprises a thickness-reduced center hollow portion 73 and a ridged peripheral portion 75. The ridged peripheral portion 75 extends annularly surrounding the periphery of the thickness-reduced center hollow portion 73. An upper surface of the thickness-reduced center hollow portion 73 is lower in level than the top of the ridged peripheral portion 75. The ridged peripheral portion 75 serves as a barrier wall to flux for keeping the thickness-reduced center hollow portion 73 from the flux.

The ridged peripheral portion 75 extends annularly surrounding the periphery of the thickness-reduced center hollow portion 73. The ridged peripheral portion 75 includes an inside wall, an outside wall opposite to the inside wall as well as a rounded groove. The rounded groove is bounded between the inside and outside walls. The rounded groove extends outside the inside wall and inside the outside wall. The rounded groove has a circular band shape in the plan view. The rounded groove has an arched-shape in cross sectional view. In the geometrical viewpoint, the three dimensional shape of the rounded groove corresponds to a bottom half of a torus. The rounded groove provides a substrate bonding face 76 for bonding with the cap 74.

The cap 74 is bonded or adhered to the substrate bonding face 76 comprising the rounded groove of the ridged peripheral portion 75 of the resin substrate 72, whereby in cooperation with the resin substrate 72, the cap 74 defines a cavity 24 which accommodates the semiconductor chip 18. The cavity also contributes to reduce the parasitic capacitance. The cap 74 comprises a disk-shaped body 77 and a ridged peripheral portion 79 which extends annularly surrounding a periphery of the disk-shaped body 77. The disk-shaped body 77 is generally flat and relatively thin. The ridged peripheral portion 79 is ridged downwardly and toward the resin substrate 72.

The ridged peripheral portion 79 includes an inside wall, an outside wall opposite to the inside wall as well as a rounded ridge, provided that the cap 74 is bonded to the resin substrate 72 and the inner wall is faced down. The rounded ridge is bounded between the inside and outside walls. The rounded ridge extends outside the inside wall and inside the outside wall. The rounded ridge has a circular band shape in the bottom view. In the geometrical viewpoint, the three dimensional shape of the inwardly sloped-down face corresponds to a bottom half of a torus.

The rounded ridge of the cap 74 provides a cap bonding face 78 which is adjusted with and engaged with the substrate bonding face 76 of the resin substrate 72. The cap bonding face 78 has a curvature which is substantially identical with a center region of the above substrate bonding face 76, so that the cap bonding face 78 is tightly contact and engaged with the substrate bonding face 76.

As well illustrated, the cap bonding face 78 is narrower in width than the substrate bonding face 76. The substrate bonding face 76 has an inside extending region which further extends in the inward and upward direction from the inside periphery of the cap bonding face 78. The inside extending region of the substrate bonding face 76 makes it difficult that a part of the flux crimes up in the inward direction along the inside extending region assuming that the part of the flux passes through the interface between the substrate bonding face 76 and the cap bonding face 78 due to capillary phenomenon. This ensures to prevent the flux from entering into the cavity.

The above package 70 provides the following advantages.

The thickness-reduced center hollow portion 73 contributes to form the cavity 24 which accommodates the semiconductor chip 18, whilst the resin substrate 72 and the cap 74 are relatively reduced in height or thickness, and thus the total height or thickness of the package is reduced.

The upper surface of the thickness-reduced center hollow portion 73, on which the semiconductor chip 18 is mounted, is lower in level than the top of the ridged peripheral portion 75 of the resin substrate 72. This structural feature may advantageously prevent an undesirable entry of flux into the cavity 24. Namely, the ridged peripheral portion 75 serves as a barrier wall to flux which surrounds the thickness-reduced center hollow portion 73, on which the semiconductor chip 18 is mounted. The flux barrier wall of the ridged peripheral portion 75 is effective to prevent the entry of flux into the cavity 24. This may cause no failure to the electrical characteristic and performance of the packaged semiconductor device.

Further, the rounded groove of the substrate bonding face 76 may trap or capture the flux and an excess part of the used adhesive agent to prevent the flux and the excess part of the used adhesive agent from entering into the cavity 24 and from being adhered onto the semiconductor chip 18.

The above structural feature may also advantageously allow an effective reduction in thickness of the thickness-reduced center hollow portion 73 so that a distance between upper and bottom surfaces of the thickness-reduced center hollow portion 73 is reduced, thereby allowing a reduction in the length of the leads 14 which extends from the upper surface of the thickness-reduced center hollow portion 73 to the bottom periphery of the resin substrate 72. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 74 with ensuring the sufficient space of the cavity 24 which accommodates the semiconductor chip 18. This allows an effective reduction in the total height of the package.

Further, the cap bonding face 78 and the substrate bonding face 76 are engaged tightly with each other, and the cap bonding face 78, and the substrate bonding face 76 comprise the rounded ridge and the rounded groove, which causes a self-alignment function for self-aligning the cap 74 to the resin substrate 72 due to a self-weight of the cap 74. This self-alignment function allows a desirable automatic assembling process by using an automatic assembling machine without any excess high handing-accuracy. The above self-alignment function makes non-defective the external dimension of the package 70. The non-defective external dimension of the package 70 makes the metal wirings free from any undesirable disconnection. The above self-alignment function also allows the mass production and improves the yield of the final product.

In addition, the cap bonding face 78 is narrower in width than the substrate bonding face 76. The substrate bonding face 76 has an inside extending region which further extends in the inward and upward direction from the inside periphery of the cap bonding face 78. The inside extending region of the substrate bonding face 76 makes it difficult that a part of the flux climes up in the inward direction along the inside extending region, assuming that the part of the flux passes through the interface between the substrate bonding face 76 and the cap bonding face 78 due to capillary phenomenon. This ensures to prevent the flux from entering into the cavity.

Figure 6:
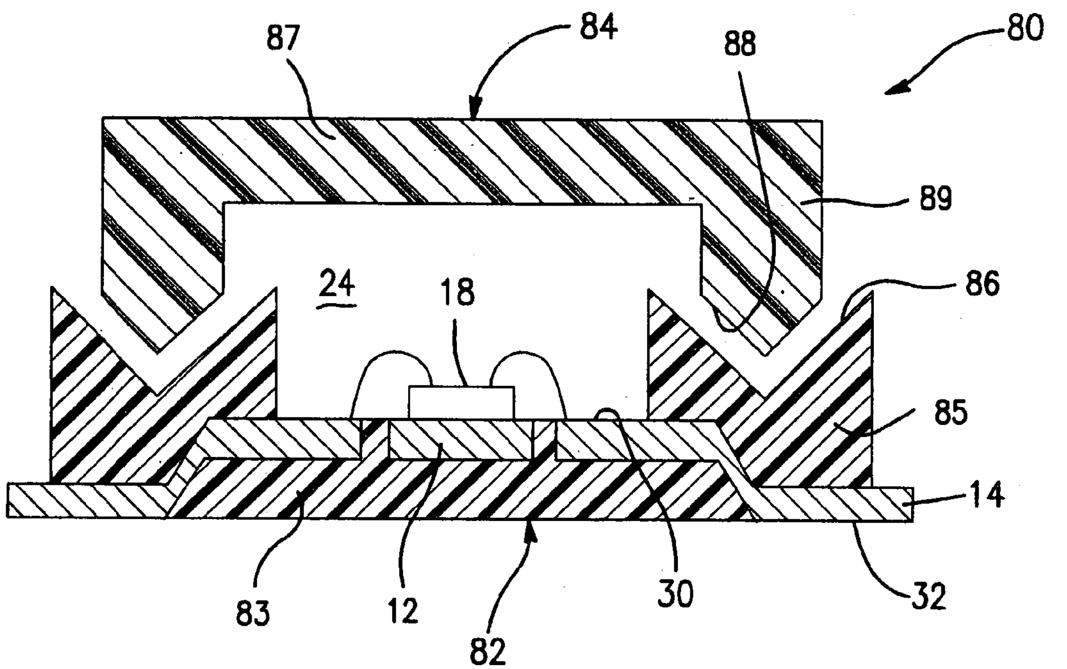
FIG. 6 is a cross sectional elevation view illustrative of an internal structure of a novel package with a cavity structure in a fifth embodiment in accordance with the present invention.

Fifth Embodiment:

A fifth embodiment according to the present invention will be described in detail with reference to the drawings. FIG. 6 is a cross sectional elevation view illustrative of an internal structure of a novel package with a cavity structure in a fifth embodiment in accordance with the present invention. The package of this fifth embodiment is different from the package of the first embodiment in the substrate and cap bonding faces.

A package 80 with a cavity structure includes a resin substrate 82, a semiconductor chip 18, and a cap 84. The resin substrate 82 further includes a die pad 12 and a set of four leads 14. The resin substrate 82 comprises a thickness-reduced center hollow portion 83 and a ridged peripheral portion 85. The ridged peripheral portion 85 extends annularly surrounding the periphery of the thickness-reduced center hollow portion 83. An upper surface of the thickness-reduced center hollow portion 83 is lower in level than the top of the ridged peripheral portion 85. The ridged peripheral portion 85 serves as a barrier wall to flux for keeping the thickness-reduced center hollow portion 83 from the flux.

The ridged peripheral portion 85 extends annularly surrounding the periphery of the thickness-reduced center hollow portion 83. The ridged peripheral portion 85 includes an inside wall, an outside wall opposite to the inside wall as well as a V-shaped groove. The V-shaped groove is bounded between the inside and outside walls. The V-shaped groove extends outside the inside wall and inside the outside wall. The V-shaped groove has a circular band shape in the plan view. The V-shaped groove has a V-shaped in cross sectional view. The V-shaped groove provides a substrate bonding face 86 for bonding with the cap 84.

The cap 84 is bonded or adhered to the substrate bonding face 86 comprising the V-shaped groove of the ridged peripheral portion 85 of the resin substrate 82, whereby in co-operation with the resin substrate 82, the cap 84 defines a cavity 24 which accommodates the semiconductor chip 18. The cavity also contributes to reduce the parasitic capacitance. The cap 84 comprises a disk-shaped body 87 and a ridged peripheral portion 89 which extends annularly surrounding a periphery of the disk-shaped body 87. The disk-shaped body 87 is generally flat and relatively thin. The ridged peripheral portion 89 is ridged downwardly and toward the resin substrate 82.

The ridged peripheral portion 89 includes an inside wall, an outside wall opposite to the inside wall as well as a V-shaped ridge, provided that the cap 84 is bonded to the resin substrate 82 and the inner wall is faced down. The V-shaped ridge is bounded between the inside and outside walls. The V-shaped ridge extends outside the inside wall and inside the outside wall. The V-shaped ridge has a circular band shape in the bottom view.

The V-shaped ridge of the cap 84 provides a cap bonding face 88 which is adjusted with and engaged with the substrate bonding face 86 of the resin substrate 82. The cap bonding face 88 has an included angle which is substantially identical with the included angle of the above substrate bonding face 86, so that the cap bonding face 88 is tightly contact and engaged with the substrate bonding face 86.

As well illustrated, the cap bonding face 88 is narrower in width than the substrate bonding face 86. The substrate bonding face 86 has an inside extending region which further extends in the inward and upward direction from the inside periphery of the cap bonding face 88. The inside extending region of the substrate bonding face 86 makes it difficult that a part of the flux crimes up in the inward direction along the inside extending region, assuming that the part of the flux passes through the interface between the substrate bonding face 86 and the cap bonding face 88 due to capillary phenomenon. This ensures to prevent the flux from entering into the cavity.

The above package 80 provides the following advantages.

The thickness-reduced center hollow portion 83 contributes to form the cavity 24 which accommodates the semiconductor chip 18, whilst the resin substrate 82 and the cap 84 are relatively reduced in height or thickness, and thus the total height or thickness of the package is reduced.

The upper surface of the thickness-reduced center hollow portion 83, on which the semiconductor chip 18 is mounted, is lower in level than the top of the ridged peripheral portion 85 of the resin substrate 82. This structural feature may advantageously prevent an undesirable entry of flux into the cavity 24. Namely, the ridged peripheral portion 85 serves as a barrier wall to flux which surrounds the thickness-reduced center hollow portion 83, on which the semiconductor chip 18 is mounted. The flux barrier wall of the ridged peripheral portion 85 is effective to prevent the entry of flux into the cavity 24. This may cause no failure to the electrical characteristic and performance of the packaged semiconductor device Further, the V-shaped groove of the substrate bonding face 86 may trap or capture the flux and an excess part of the used adhesive agent to prevent the flux and the excess part of the used adhesive agent from entering into the cavity 24 and from being adhered onto the semiconductor chip 18.

The above structural feature may also advantageously allow an effective reduction in thickness of the thickness-reduced center hollow portion 83 so that a distance between upper and bottom surfaces of the thickness-reduced center hollow portion 83 is reduced, thereby allowing a reduction in the length of the leads 14 which extends from the upper surface of the thickness-reduced center hollow portion 83 to the bottom periphery of the resin substrate 82. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 84 with ensuring the sufficient space of the cavity 24 which accommodates the semiconductor chip 18. This allows an effective reduction in the total height of the package.

Further, the cap bonding face 88 and the substrate bonding face 86 are engaged tightly with each other, and the cap bonding face 88, and the substrate bonding face 86 comprise the V-shaped ridge and the V-shaped groove, which causes a self-alignment function for self-aligning the cap 84 to the resin substrate 82 due to a self-weight of the cap 84. This self-alignment function allows a desirable automatic assembling process by using an automatic assembling machine without any excess high handing-accuracy. The above self-alignment function makes non-defective the external dimension of the package 80. The non-defective external dimension of the package 80 makes the metal wirings free from any undesirable disconnection. The above self-alignment function also allows the mass production and improves the yield of the final product.

In addition, the cap bonding face 88 is narrower in width than the substrate bonding face 86. The substrate bonding face 86 has an inside extending region which further extends in the inward and upward direction from the inside periphery of the cap bonding face 88. The inside extending region of the substrate bonding face 86 makes it difficult that a part of the flux chimes up in the inward direction along the inside extending region, assuming that the part of the flux passes through the interface between the substrate bonding face 86 and the cap bonding face 88 due to capillary phenomenon. This ensures to prevent the flux from entering into the cavity.

Figure 7:
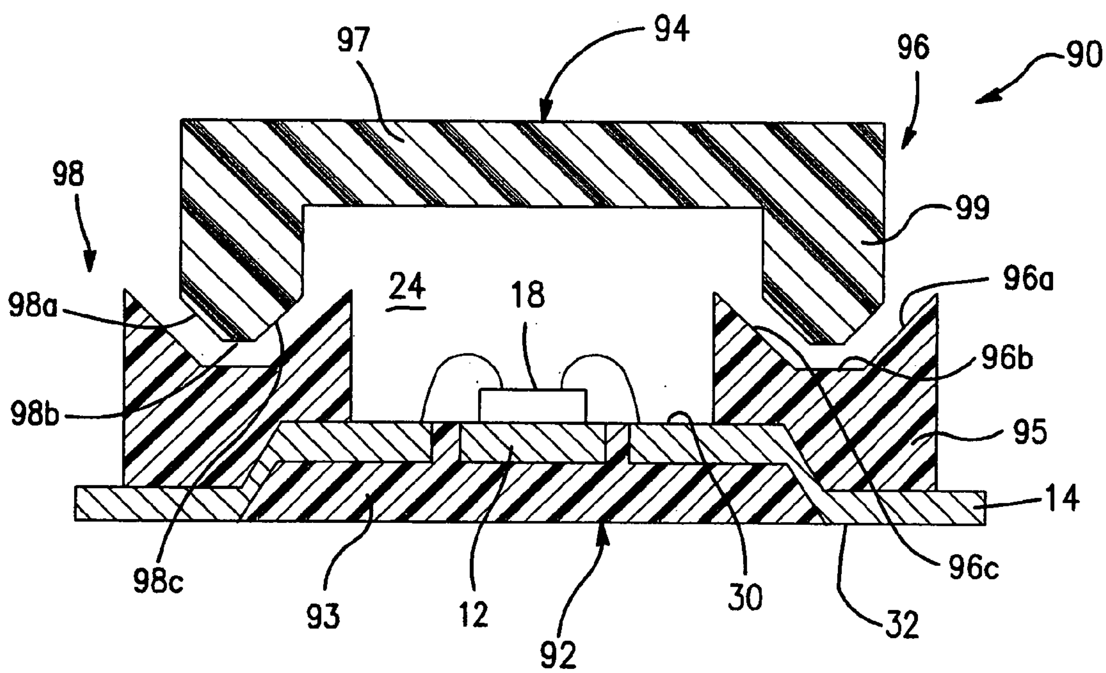
FIG. 7 is a cross sectional elevation view illustrative of an internal structure of a novel package with a cavity structure in a sixth embodiment in accordance with the present invention.

Sixth Embodiment:

A sixth embodiment according to the present invention will be described in detail with reference to the drawings. FIG. 7 is a cross sectional elevation view illustrative of an internal structure of a novel package with a cavity structure in a sixth embodiment in accordance with the present invention. The package of this sixth embodiment is different from the package of the first embodiment in the substrate and cap bonding faces.

A package 90 with a cavity structure includes a resin substrate 92, a semiconductor chip 18, and a cap 94. The resin substrate 92 further includes a die pad. 12 and a set of four leads 14. The resin substrate 92 comprises a thickness-reduced center hollow portion 93 and a ridged peripheral portion 95. The ridged peripheral portion 95 extends annularly surrounding the periphery of the thickness-reduced center hollow portion 93. An upper surface of the thickness-reduced center hollow portion 93 is lower in level than the top of the ridged peripheral portion 95. The ridged peripheral portion 95 serves as a barrier wall to flux for keeping the thickness-reduced center hollow portion 93 from the flux.

The ridged peripheral portion 95 extends annularly surrounding the periphery of the thickness-reduced center hollow portion 93. The ridged peripheral portion 95 includes an inside wall, an outside wall opposite to the inside wall as well as a trapezoid-shaped groove. The trapezoid-shaped groove is bounded between the inside and outside walls. The trapezoid-shaped groove extends outside the inside wall and inside the outside wall. The trapezoid-shaped groove has a circular band shape in the plan view. The trapezoid-shaped groove has a trapezoid-shape in cross sectional view. The trapezoid-shaped groove provides a substrate bonding face 96 for bonding with the cap 94.

The trapezoid-shaped groove as the substrate bonding face 96 further comprises an inwardly sloped down face, a flat bottom face and an outwardly sloped down face. The inwardly sloped down face is bounded between the outside wall and the flat bottom face. The inwardly sloped down face extends outside the flat bottom face and inside the outside wall. The inwardly sloped down face has an uniform slope angle. The flat bottom face is bounded between the inwardly sloped down face and the outwardly sloped down face. The flat bottom face extends outside the outwardly sloped down face and inside the inwardly sloped down face. The flat bottom face has a horizontal face. The outwardly sloped down face is bounded between the inside wall and the flat bottom face. The outwardly sloped down face extends inside the flat bottom face and outside the inside wall. The outwardly sloped down face has an uniform slope angle. The inwardly sloped down face provides a first substrate bonding face 96*a*. The flat bottom face provides a second substrate bonding face 96*b*. The outwardly sloped down face provides a third substrate bonding face 96*c*. The above substrate bonding face 96 further comprises the first to third substrate bonding faces 96*a*, 96*b* and 96*c*.

The cap 94 is bonded or adhered to the substrate bonding face 96 comprising the trapezoid-shaped groove of the ridged peripheral portion 95 of the resin substrate 92, whereby in co-operation with the resin substrate 92, the cap 94 defines a cavity 24 which accommodates the semiconductor chip 13. The cavity also contributes to reduce the parasitic capacitance. The cap 94 comprises a disk-shaped body 97 and a ridged peripheral portion 99 which extends annularly surrounding a periphery of the disk-shaped body 97. The disk-shaped body 97 is generally flat and relatively thin. The ridged peripheral portion 99 is ridged downwardly and toward the resin substrate 92.

The ridged peripheral portion 99 includes an inside wall, an outside wall opposite to the inside wall as well as a trapezoid-shaped ridge, provided that the cap 94 is bonded to the resin substrate 92 and the inner wall is faced down. The trapezoid-shaped ridge is bounded between the inside and outside walls. The trapezoid-shaped ridge extends outside the inside wall and inside the outside wall. The trapezoid-shaped ridge has a circular band shape in the bottom view.

The trapezoid-shaped ridge of the cap 94 provides a cap bonding face 98 which is adjusted with and engaged with the substrate bonding face 96 of the resin substrate 92. The cap bonding face 98 has a sectioned shape which is substantially identical with the above substrate bonding face 96, so that the cap bonding face 98 is tightly contact and engaged with the substrate bonding face 96.

The trapezoid-shaped ridge as the cap bonding face 98 further comprises an inwardly sloped down face, a flat top face and an outwardly sloped down face. The inwardly sloped down face is bounded between the outside wall and the flat top face. The inwardly sloped down face extends outside the flat top face and inside the outside wall. The inwardly sloped down face has an uniform slope angle which is identical with the inwardly sloped down face of the trapezoid-shaped groove 96. The flat top face is bounded between the inwardly sloped down face and the outwardly sloped down face. The flat top face extends outside the outwardly sloped down face and inside the inwardly sloped down face. The flat top face has a horizontal face. The outwardly sloped down face is bounded between the inside wall and the flat top face. The outwardly sloped down face extends inside the flat top face and outside the inside wall. The outwardly sloped down face has an uniform slope angle which is identical with the outwardly sloped down face of the trapezoid-shaped groove 98. The inwardly sloped down face provides a first cap bonding face 98*a*. The flat bottom face provides a second cap bonding face 98*b*. The outwardly sloped down face provides a third cap bonding face 98*c*. The above cap bonding face 98 further comprises the first to third cap bonding faces 98*a*, 98*b* and 98*c*. The first cap bonding face 98*a* is engaged with the first substrate bonding face 96*a*. The second cap bonding face 98*b* is engaged with the second substrate bonding face 96*b*. The third cap bonding face 98*c* is engaged with the third substrate bonding face 96*c*.

As well illustrated, the cap bonding face 98 is narrower in width than the substrate bonding face 96. The substrate bonding face 96 has an inside extending region which further extends in the inward and upward direction form the inside periphery of the cap bonding face 98. The inside extending region of the substrate bonding face 96 makes it difficult that a part of the flux crimes up in the inward direction along the inside extending region, assuming that the part of the flux passes through the interface between the substrate bonding face 96 and the cap bonding face 98 due to capillary phenomenon. This ensures to prevent the flux from entering into the cavity.

The above package 90 provides the following advantages.

The thickness-reduced center hollow portion 93 contributes to form the cavity 24 which accommodates the semiconductor chip 18, whilst the resin substrate 92 and the cap 94 are relatively reduced in height or thickness, and thus the total height or thickness of the package is reduced.

The upper surface of the thickness-reduced center hollow portion 93, on which the semiconductor chip 18 is mounted, is lower in level than the top of the ridged peripheral portion 95 of the resin substrate 92. This structural feature may advantageously prevent an undesirable entry of flux into the cavity 24. Namely, the ridged peripheral portion 95 serves as a barrier wall to flux which surrounds the thickness-reduced center hollow portion 93, on which the semiconductor chip 18 is mounted. The flux barrier wall of the ridged peripheral portion 95 is effective to prevent the entry of flux into the cavity 24. This may cause no failure to the electrical characteristic and performance of the packaged semiconductor device.

Further, the trapezoid-shaped groove of the substrate bonding face 96 may trap or capture the flux and an excess part of the used adhesive agent to prevent the flux and the excess part of the used adhesive agent from entering into the cavity 24 and from being adhered onto the semiconductor chip 18.

The above structural feature may also advantageously allow an effective reduction in thickness of the thickness-reduced center hollow portion 93 so that a distance between upper and bottom surfaces of the thickness-reduced center hollow portion 93 is reduced, thereby allowing a reduction in the length of the leads 14 which extends from the upper surface of the thickness-reduced center hollow portion 93 to the bottom periphery of the resin substrate 92. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 94 with ensuring the sufficient space of the cavity 24 which accommodates the semiconductor chip 18. This allows an effective reduction in the total height of the package.

Further, the cap bonding face 98 and the substrate bonding face 96 are engaged tightly with each other, and the cap bonding face 98, and the substrate bonding face 96 comprise the trapezoid-shaped ridge and the trapezoid-shaped groove, which causes a self-alignment function for self-aligning the cap 94 to the resin substrate 92 due to a self-weight of the cap 94. This self-alignment function allows a desirable automatic assembling process by using an automatic assembling machine without any excess high handing-accuracy. The above self-alignment function makes non-defective the external dimension of the package 90. The non-defective external dimension of the package 90 makes the metal wirings free from any undesirable disconnection. The above self-alignment function also allows the mass production and improves the yield of the final product.

In addition, the cap bonding face 98 is narrower in width than the substrate bonding face 96. The substrate bonding face 96 has an inside extending region which further extends in the inward and upward direction from the inside periphery of the cap bonding face 98. The inside extending region of the substrate bonding face 96 makes it difficult that a part of the flux climes up in the inward direction along the inside extending region, assuming that the part of the flux passes through the interface between the substrate bonding face 96 and the cap bonding face 98 due to capillary phenomenon. This ensures to prevent the flux from entering into the cavity.

Moreover, the combination of the second substrate bonding face **96*b* and the second cap bonding face 98*b* makes it easy to apply an adhesive agent onto at least one of the second substrate bonding face 96*b* and the second cap bonding face 98*b* for bonding the cap 94 to the resin substrate 92. This may contribute to improve the productivity of the package 90**.

Figure 8:
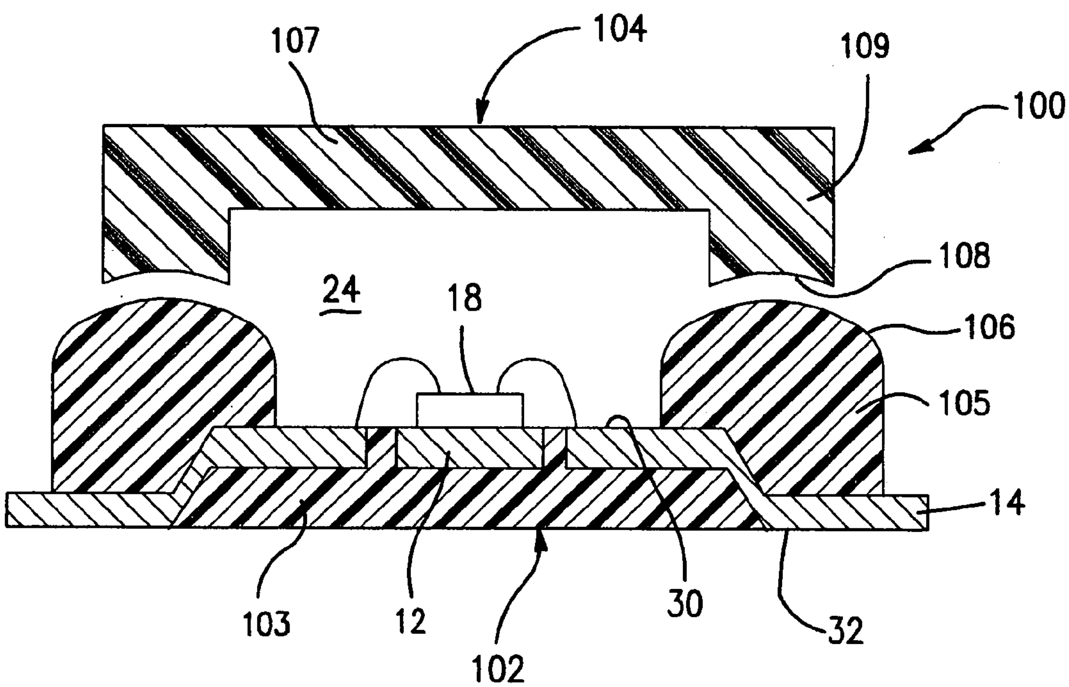
FIG. 8 is a cross sectional elevation view illustrative of an internal structure of a novel package with a cavity structure in a seventh embodiment in accordance with the present invention.

Seventh Embodiment:

A seventh embodiment according to the present invention will be described in detail with reference to the drawings. FIG. 8 is a cross sectional elevation view illustrative of an internal structure of a novel package with a cavity structure in a seventh embodiment in accordance with the present invention. The package of this seventh embodiment is different from the package of the first embodiment in the substrate and cap bonding faces.

A package 100 with a cavity structure includes a resin substrate 102, a semiconductor chip 18, and a cap 104. The resin substrate 102 further includes a die pad 12 and a set of four leads 14. The resin substrate 102 comprises a thickness-reduced center hollow portion 103 and a ridged peripheral portion 105. The ridged peripheral portion 105 extends annularly surrounding the periphery of the thickness-reduced center hollow portion 103. An upper surface of the thickness-reduced center hollow portion 103 is lower in level than the top of the ridged peripheral portion 105. The, ridged peripheral portion 105 serves as a barrier wall to flux for keeping the thickness-reduced center hollow portion 103 from the flux.

The ridged peripheral portion 105 extends annularly surrounding the periphery of the thickness-reduced center hollow portion 103. The ridged peripheral portion 105 includes an inside wall, an outside wall opposite to the inside wall as well as a rounded ridge. The rounded ridge is bounded between the inside and outside walls. The rounded ridge extends outside the inside wall and inside the outside wall. The rounded ridge has a circular band shape in the plan view. The rounded ridge has an arched-shape in cross sectional view. The rounded ridge provides a substrate bonding face 106 for bonding with the cap 104.

The cap 104 is bonded or adhered to the substrate bonding face 106 comprising the rounded ridge of the ridged peripheral portion 105 of the resin substrate 102, whereby in co-operation with the resin substrate 102, the cap 104 defines a cavity 24 which accommodates the semiconductor chip 18. The cavity also contributes to reduce the parasitic capacitance. The cap 104 comprises a disk-shaped body 107 and a ridged peripheral portion 109 which extends annularly surrounding a periphery of the disk-shaped body 107. The disk-shaped body 107 is generally flat and relatively thin. The ridged peripheral portion 109 is ridged downwardly and toward the resin substrate 102.

The ridged peripheral portion 109 includes an inside wall, an outside wall opposite to the inside wall as well as a rounded groove, provided that the cap 104 is bonded to the resin substrate 102 and the inner wall is faced down. The rounded groove is bounded between the inside and outside walls. The rounded groove extends outside the inside wall and inside the outside wall. The rounded groove has a circular band shape in the bottom view.

The rounded groove of the cap 104 provides a cap bonding face 108 which is adjusted with and engaged with the substrate bonding face 106 of the resin substrate 102. The cap bonding face 108 has a curvature which is substantially identical with a center region of the above substrate bonding face 106, so that the cap bonding face 108 is tightly contact and engaged with the substrate bonding face 106. As well illustrated, the cap bonding face 108 is narrower in width than the substrate bonding face 106. The substrate bonding face 106 has an inside extending region which further extends in the inward and downward direction from the inside periphery of the cap bonding face 108.

The above package 100 provides the following advantages.

The thickness-reduced center hollow portion 103 contributes to form the cavity 24 which accommodates the semiconductor chip 18, whilst the resin substrate 102 and the cap 104 are relatively reduced in height or thickness, and thus the total height or thickness of the package is reduced.

The upper surface of the thickness-reduced center hollow portion 103, on which the semiconductor chip 18 is mounted, is lower in level than the top of the ridged peripheral portion 105 of the resin substrate 102. This structural feature may advantageously prevent an undesirable entry of flux into the cavity 24. Namely, the ridged peripheral portion 105 serves as a barrier wall to flux which surrounds the thickness-reduced center hollow portion 103, on which the semiconductor chip 18 is mounted. The flux barrier wall of the ridged peripheral portion 105 is effective to prevent the entry of flux into the cavity 24. This may cause no failure to the electrical characteristic and performance of the packaged semiconductor device.

The above structural feature may also advantageously allow an effective reduction in thickness of the thickness-reduced center hollow portion 103 so that a distance between upper and bottom surfaces of the thickness-reduced center hollow portion 103 is reduced, thereby allowing a reduction in the length of the leads 14 which extends from the upper surface of the thickness-reduced center hollow portion 103 to the bottom periphery of the resin substrate 102. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 104 with ensuring the sufficient space of the cavity 24 which accommodates the semiconductor chip 18. This allows an effective reduction in the total height of the package.

Further, the cap bonding face 108 and the substrate bonding face 106 arc engaged tightly with each other, and the cap bonding face 108, and the substrate bonding face 106 comprise the rounded groove and the rounded ridge, which causes a self-alignment function for self-aligning the cap 104 to the resin substrate 102 due to a self-weight of the cap 104. This self-alignment function allows a desirable automatic assembling process by using in automatic assembling machine without any excess high handing-accuracy. The above self-alignment function makes non-defective the external dimension of the package 100. The non-defective external dimension of the package 100 makes the metal wirings free from any undesirable disconnection. The above self-alignment function also allows the mass production and improves the yield of the final product.

Figure 9:
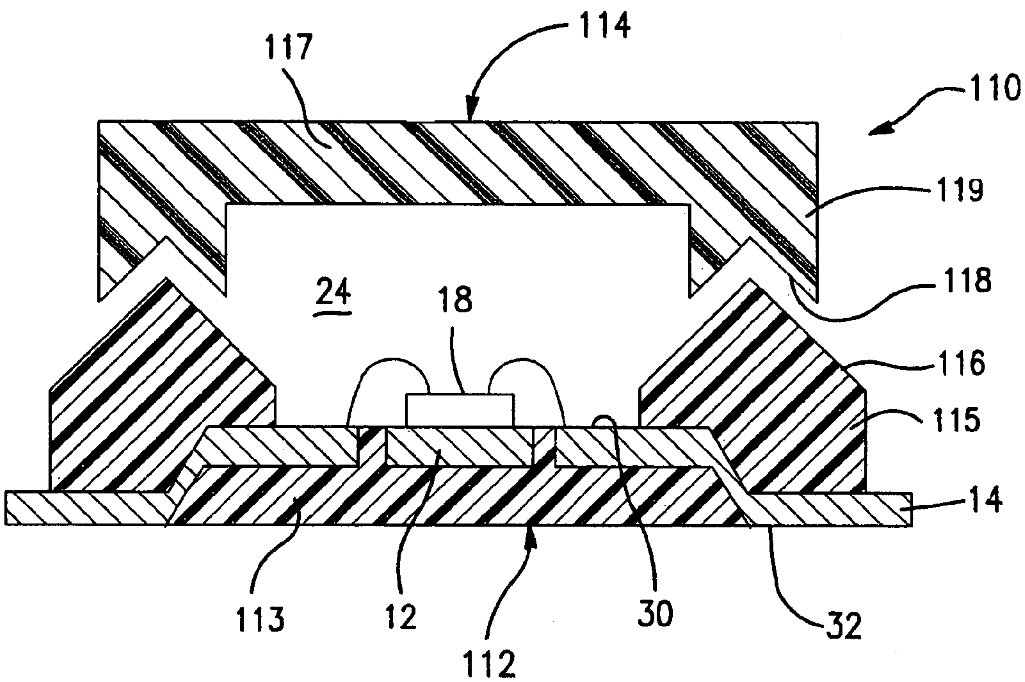
FIG. 9 is a cross sectional elevation view illustrative of an internal structure of a novel package with a cavity structure in an eighth embodiment in accordance with the present invention.

Eighth Embodiment:

An eighth embodiment according to the present invention will be described in detail with reference to the drawings. FIG. 9 is a cross sectional elevation view illustrative of an internal structure of a novel package with a cavity structure in an eighth embodiment in accordance with the present invention. The package of this eighth embodiment is different from the package of the first embodiment in the substrate and cap bonding faces.

A package 110 with a cavity structure includes a resin substrate 112, a semiconductor chip 18, and a cap 114. The resin substrate 112 further includes a die pad 12 and a set of four leads 14. The resin substrate 112 comprises a thickness-reduced center hollow portion 113 and a ridged peripheral portion 115. The ridged peripheral portion 115 extends annularly surrounding the periphery of the thickness-reduced center hollow portion 113. An upper surface of the thickness-reduced center hollow portion 113 is lower in level than the top of the ridged peripheral portion 115. The ridged peripheral portion 115 serves as a barrier wall to flux for keeping the thickness-reduced center hollow portion 113 from the flux.

The ridged peripheral portion 115 extends annularly surrounding the periphery of the thickness-reduced center hollow portion 113. The ridged peripheral portion 115 includes an inside wall, an outside wall opposite to the inside wall as well as a V-shaped ridge. The V-shaped ridge is bounded between the inside and outside walls. The V-shaped ridge extends outside the inside wall and inside the outside wall. The V-shaped ridge has a circular band shape in the plan view. The V-shaped ridge has a V-shape in cross sectional view. The V-shaped ridge provides a substrate bonding face 116 for bonding with the cap 114.

The cap 114 is bonded or adhered to the substrate bonding face 116 comprising the V-shaped ridge of the ridged peripheral portion 115 of the resin substrate 112, whereby in co-operation with the resin substrate 112, the cap 114 defines a cavity 24 which accommodates the semiconductor chip 18. The cavity also contributes to reduce the parasitic capacitance. The cap 114 comprises a disk-shaped body 117 and a ridged peripheral portion 119 which extends annularly surrounding a periphery of the disk-shaped body 117. The disk-shaped body 117 is generally flat and relatively thin. The ridged peripheral portion 119 is ridged downwardly and toward the resin substrate 112.

The ridged peripheral portion 119 includes an inside wall, an outside, wall opposite to the inside wall as well as a V-shaped groove, provided that the cap 114 is bonded to the resin substrate 112 and the inner wall is faced down. The V-shaped groove is bounded between the inside and outside walls. The V-shaped groove extends outside the inside wall and inside the outside wall. The V-shaped groove has a circular band shape in the bottom view.

The V-shaped groove of the cap 114 provides a cap bonding face 118 which is adjusted with and engaged with the substrate bonding face 116 of the resin substrate 112. The cap bonding face 118 has an included angle which is substantially identical with a center region of the above substrate bonding face 116, so that the cap bonding face 118 is tightly contact and engaged with the substrate bonding face 116. As well illustrated, the cap bonding face 118 is narrower in width than the substrate bonding face 116. The substrate bonding face 116 has an inside extending region which further extends in the inward and downward direction from the inside periphery of the cap bonding face 118.

The above package 110 provides the following advantages.

The thickness-reduced center hollow portion 113 contributes to form the cavity 24 which accommodates the semiconductor chip 18, whilst the resin substrate 112 and the cap 114 are relatively reduced in height or thickness, and thus the total height or thickness of the package is reduced.

The upper surface of the thickness-reduced center hollow portion 113, on which the semiconductor chip 18 is mounted, is lower in level than the top of the ridged peripheral portion 115 of the resin substrate 112. This structural feature may advantageously prevent an undesirable entry of flux into the cavity 24. Namely, the ridged peripheral portion 115 serves as a barrier wall to flux which surrounds the thickness-reduced center hollow portion 113, on which the semiconductor chip 18 is mounted. The flux barrier wall of the ridged peripheral portion 115 is effective to prevent the entry of flux into the cavity 24. This may cause no failure to the electrical characteristic and performance of the packaged semiconductor device.

The above structural feature may also advantageously allow an effective reduction in thickness of the thickness-reduced center hollow portion 113 so that a distance between upper and bottom surfaces of the thickness-reduced center hollow portion 113 is reduced, thereby allowing a reduction in the length of the leads 14 which extends from the upper surface of the thickness-reduced center hollow portion 113 to the bottom periphery of the resin substrate 112. The reduction in length of the leads 14 decreases the inductance thereof. The decrease in the inductance of the leads 14 makes it easy to suppress the undesirable high frequency loss of the high frequency semiconductor device.

The above structural feature may further provide an effective reduction in height of the cap 114 with ensuring the sufficient space of the cavity 24 which accommodates the semiconductor chip 18. This allows an effective reduction in the total height of the package.

Further, the cap bonding face 118 and the substrate bonding face 116 are engaged tightly with each other, and the cap bonding face 118, and the substrate bonding face 116 comprise the V-shaped groove and the V-shaped ridge, which causes a self-alignment function for self-aligning the cap 114 to the resin substrate 112 due to a self-weight of the cap 114. This self-alignment function allows a desirable automatic assembling process by using an automatic assembling machine without any excess high handing-accuracy. The above self-alignment function makes non-defective the external dimension of the package 110. The non-defective external dimension of the package 110 makes the metal wirings free from any undesirable disconnection. The above self-alignment function also allows the mass production and improves the yield of the final product.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions arc expressly understood to fall within the true scope and spirit of the appended claims.

What is claimed is:

1. A package including:

a substrate including a ridged peripheral portion and a center portion defined by said ridged peripheral portion, an upper surface of said center portion being lower in level than a top of said ridged peripheral portion;

a semiconductor chip mounted on said upper surface of said center portion;

a plurality of leads electrically coupled to said semiconductor chip, each of said plurality of leads penetrating said substrate outwardly from said center portion and extending out of said substrate; and a cap defining a cavity space which accommodates said semiconductor chip, said cap having a cap bonding face bonded with a substrate bonding face of said ridged peripheral portion, wherein each of said cap bonding face and said substrate bonding face includes at least one inclined face.

2. The package as claimed in claim 1, wherein said cap bonding face and said substrate bonding face are engaged with each other.

3. The package as claimed in claim 1, wherein each of said cap bonding face and said substrate bonding face comprises an inwardly sloped-down plane surface which annularly extends.

4. The package as claimed in claim 1, wherein each of said cap bonding face and said substrate bonding face comprises a combination of a sloped plane surface and a horizontal and flat surface which annularly extend.

5. The package as claimed in claim 1, wherein each of said cap bonding face and said substrate bonding face comprises an outwardly sloped-down plane surface which annularly extends.

6. The package as claimed in claim 1, wherein first one of said cap bonding face and said substrate bonding face includes at least a convexity which annularly extends and second one thereof comprises a concavity which annularly extends and engaged with said convexity.

7. The package as claimed in claim 6, wherein said convexity comprises a rounded ridge which annularly extends, and said concavity comprises a rounded groove which annularly extends and is engaged with said rounded ridge.

8. The package as claimed in claim 7, wherein said cap bonding face comprises said rounded ridge and said substrate bonding face comprises said rounded groove.

9. The package as claimed in claim 7, wherein said cap bonding face comprises said rounded groove and said substrate bonding face comprises said rounded ridge.

10. The package as claimed in claim 6, wherein said convexity comprises a tapered ridge which annularly extends, and said concavity comprises a tapered groove which annularly extends and is engaged with said tapered ridge.

11. The package as claimed in claim 10, wherein said cap bonding face comprises said tapered ridge and said substrate bonding face comprises said tapered groove.

12. The package as claimed in claim 10, wherein said cap bonding face comprises said tapered groove and said substrate bonding face comprises said tapered ridge.

13. The package as claimed in claim 10, wherein said tapered ridge comprises a V-shaped ridge, and said tapered groove comprises a V-shaped groove.

14. The package as claimed in claim 10, wherein said tapered ridge comprises a trapezoid-shaped ridge, and said tapered groove comprises a trapezoid-shaped groove.

15. The package as claimed in claim 1, wherein said plurality of leads extends sloped from said upper surface of said center portion to a bottom periphery of said substrate.

16. The package as claimed in claim 1, wherein said cap comprises a flat body and a peripheral portion which has said cap bonding face.

17. The package as claimed in claim 1, wherein said plurality of leads are four in number and each of said four leads extends radially and outwardly from said upper surface of said center portion, so that each lead is spaced substantially 90° from an adjacent one of said four leads.

18. A package including:

a substrate having a peripheral portion and a center hollow portion defined by said peripheral portion, and an upper surface of said center hollow portion being lower in level than a top of said peripheral portion;

a semiconductor chip mounted on said upper surface of said center hollow portion;

a plurality of leads being electrically coupled to said semiconductor chip and said plurality of leads penetrating said substrate and extending sloped from said upper surface of said center hollow portion to a bottom periphery of said substrate; and a cap defining a cavity space which accommodates said semiconductor chip, and said cap comprising a flat body and a peripheral portion which has a cap bonding face bonded with a substrate bonding face of said peripheral portion, and said cap bonding face and said substrate bonding face being higher in level than said upper surface of said center hollow portion, said cap bonding face and said substrate bonding face being engaged with each other, and each of said cap bonding face and said substrate bonding face includes at least one inclined face.

19. The package as claimed in claim 18, wherein each of said cap bonding face and said substrate bonding face comprises an inwardly sloped-down plane surface which annularly extends.

20. The package as claimed in claim 18, wherein each of said cap bonding face and said substrate bonding face comprises a combination of a sloped plane surface and a horizontal and flat surface which annularly extend.

21. The package as claimed in claim 18, wherein each of said cap bonding face and said substrate bonding face comprises an outwardly sloped-down plane surface which annularly extends.

22. The package as claimed in claim 18, wherein first one of said cap bonding face and said substrate bonding face includes at least a convexity which annularly extends and second one thereof comprises a concavity which annularly extends and engaged with said convexity.

23. The package as claimed in claim 22, wherein said convexity comprises a rounded ridge which annularly extends, and said concavity comprises a rounded groove which annularly extends and is engaged with said rounded ridge.

24. The package as claimed in claim 23, wherein said cap bonding face comprises said rounded ridge and said substrate bonding face comprises said rounded groove.

25. The package as claimed in claim 23, wherein said cap bonding face comprises said rounded groove and said substrate bonding face comprises said rounded ridge.

26. The package as claimed in claim 22, wherein said convexity comprises a tapered ridge which annularly extends, and said concavity comprises a tapered groove which annularly extends and is engaged with said tapered ridge.

27. The package as claimed in claim 26, wherein said cap bonding face comprises said tapered ridge and said substrate bonding face comprises said tapered groove.

28. The package as claimed in claim 26, wherein said cap bonding face comprises said tapered groove and said substrate bonding face comprises said tapered ridge.

29. The package as claimed in claim 26, wherein said tapered ridge comprises a V-shaped ridge, and said tapered groove comprises a V-shaped groove.

30. The package as claimed in claim 26, wherein said tapered ridge comprises a trapezoid-shaped ridge, and said tapered groove comprises a trapezoid-shaped groove.

* * * * *